United States Patent
Lai et al.

(10) Patent No.: US 10,453,856 B1
(45) Date of Patent: Oct. 22, 2019

(54) LOW RESISTANCE VERTICAL CHANNEL 3D MEMORY

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/938,695

(22) Filed: Mar. 28, 2018

(51) Int. Cl.
*H01L 27/11* (2006.01)
*H01L 29/792* (2006.01)
*H01L 29/66* (2006.01)
*H01L 27/1157* (2017.01)
*H01L 27/11582* (2017.01)

(52) U.S. Cl.
CPC .... *H01L 27/1157* (2013.01); *H01L 27/11582* (2013.01); *H01L 29/66833* (2013.01); *H01L 29/7926* (2013.01)

(58) Field of Classification Search
CPC ........... H01L 27/1157; H01L 27/11582; H01L 29/66833; H01L 29/7926
USPC ................................. 257/324, 329; 438/268
See application file for complete search history.

(56) References Cited

U.S. PATENT DOCUMENTS

| | | | |
|---|---|---|---|
| 7,679,133 B2 | 3/2010 | Son et al. | |
| 8,236,650 B2 | 8/2012 | Son et al. | |
| 8,492,828 B2 | 7/2013 | Son et al. | |
| 8,884,357 B2 | 11/2014 | Wang et al. | |
| 9,147,468 B1 | 9/2015 | Lue | |
| 9,165,786 B1 | 10/2015 | Purayath et al. | |
| 9,401,371 B1 | 7/2016 | Lee et al. | |
| 9,520,406 B2 | 12/2016 | Makala et al. | |
| 9,520,501 B2 | 12/2016 | Koldiaev et al. | |
| 9,524,980 B2 | 12/2016 | Lue | |

(Continued)

FOREIGN PATENT DOCUMENTS

| | | |
|---|---|---|
| CN | 106935587 A | 7/2017 |
| CN | 106558590 B | 3/2019 |

(Continued)

OTHER PUBLICATIONS

U.S. Office Action in U.S. Appl. No. 15/949,346 dated Jan. 11, 2019, 5 pages.

(Continued)

*Primary Examiner* — Caleen O Sullivan
(74) *Attorney, Agent, or Firm* — Haynes Beffel & Wolfeld LLP

(57) ABSTRACT

A memory device, which can be configured as a 3D NAND flash memory, includes a stack of conductive strips and an opening through the stack exposing sidewalls of conductive strips on first and second sides of the opening. Some of the conductive strips in the stack are configured as word lines. Data storage structures are disposed on the sidewalls of the stack. A vertical channel film is disposed vertically in contact with the data storage structures. The vertical channel film is connected at a proximal end to an upper channel pad over the stack, and at a distal end to a lower channel pad disposed in a lower level of the opening. The upper and lower channel pads may comprise an epitaxial semiconductor and be thicker than the vertical channel film disposed on the sidewalls of the stack.

19 Claims, 18 Drawing Sheets

(56) References Cited

U.S. PATENT DOCUMENTS

| | | | |
|---|---|---|---|
| 9,698,153 | B2 | 7/2017 | Liu et al. |
| 2003/0003641 | A1 | 1/2003 | Cho et al. |
| 2010/0258855 | A1 | 10/2010 | Yilmaz et al. |
| 2012/0228697 | A1* | 9/2012 | Youm .................. H01L 29/7926 257/329 |
| 2015/0104916 | A1* | 4/2015 | Lee ..................... H01L 27/1157 438/268 |
| 2016/0148948 | A1* | 5/2016 | Kim .................. H01L 27/11582 257/324 |
| 2016/0260732 | A1 | 9/2016 | Lue |
| 2016/0260733 | A1 | 9/2016 | Lue |
| 2017/0025428 | A1 | 1/2017 | Lai et al. |
| 2017/0092651 | A1* | 3/2017 | Kim .................... H01L 23/5283 |
| 2017/0194340 | A1 | 7/2017 | Lue |

FOREIGN PATENT DOCUMENTS

| | | |
|---|---|---|
| TW | 201633510 A | 9/2016 |
| TW | 201705451 A | 2/2017 |

OTHER PUBLICATIONS

Lai et al., "A Multi-Layer Stackable Thin-Film Transistor (TFT) NAND-Type Flash Memory," IEEE International Electron Devices Meeting, Dec. 11-13, 2006.

Jung et al., "Three Dimensionally Stacked NAND Flash Memory Technology Using Stacking Single Crystal Si Layers on ILD and TANOS Structure for Beyond 30nm Node," IEEE International Electron Devices Meeting, Dec. 11-13, 2006.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, Jun. 16-18, 2009, 2 pages.

Ishiduki et al., "Optimal device structure for pipe-shaped BiCS flash memory for ultra high density storage device with excellent performance and reliability," In Electron Devices Meeting (IEDM), 2009 IEEE International, 4 pages, IEEE, 2009.

TW Office Action in counterpart Application No. 107117743, dated Jun. 18, 2019, 8 pages (plus English translation).

* cited by examiner

LOW RESISTANCE VERTICAL CHANNEL 3D MEMORY

BACKGROUND

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate-all-around the cell at each layer.

In another 3D NAND flash memory technology with a vertical thin-channel memory, vertical thin-channel cells in the memory can be arranged along vertical active pillars which support cells on opposing sides of one pillar, and in some configurations comprise U-shaped semiconductor thin-film structure in which a NAND string extends down one side and up the other side of a single pillar. The active pillars are disposed between stacks of conductive strips operable as word lines with memory elements in between as described in U.S. Pat. No. 9,524,980, issued 20 Dec. 2016, which is incorporated by reference as if fully set forth herein. As a result of these structures, two memory cells are formed per frustum of the active pillar, where each memory cell at the frustum includes a channel in the U-shaped semiconductor thin-film structure on one side of the active pillar. In alternative approaches, vertical channel structures can support even and odd NAND strings on opposing sides of each vertical channel structure.

In general, vertical channel structures can suffer from high resistance, specifically in the lower region of the structure. Furthermore, it can be difficult to have a good electrical connection between the bit lines in the 3D NAND flash memory and thin films in the upper regions of the vertical channel structures.

It is desirable to provide a structure for three-dimensional integrated circuit memory with vertical channel structures having with lower resistance and higher reliability in the lower regions and having better and more reliable connection to bit lines or other conductors in the upper regions.

SUMMARY

A memory is described, which can be configured as a 3D NAND flash memory. The memory comprises a stack of conductive strips. An opening, such as a trench or a hole, through the stack exposes sidewalls of conductive strips on first and second sides of the opening. Data storage structures are disposed on the sidewalls of one or both sides of the opening and are adjacent to the conductive strips in the stack. A vertical channel structure comprising one or more vertical channel films is disposed vertically in contact with the data storage structures on one or both sides of the opening. The vertical channel structure has a proximal end at the top or upper levels of the stack and a distal end in the lower levels of the stack. In some embodiments of the vertical channel structure, the vertical channel film is connected at the proximal end to an upper channel pad disposed on top of the stack. The upper channel pad can be formed by selective epitaxy, forming a self-aligned pad of epitaxial silicon or other material, having a thickness greater than the thickness of the vertical channel film in the vertical channel structure.

In some embodiments of the vertical channel structure, the vertical channel film is connected at the distal end to a lower channel pad. The lower channel pad can be formed by selective epitaxy, forming a self-aligned pad of epitaxial silicon or other material, having a thickness greater than the thickness of the vertical channel film in the vertical channel structure. Also, the lower channel pad and the upper channel pad can be formed in the same selective epitaxy growth process, whereby self-aligned pads are formed on both the proximal and distal ends of the vertical channel structure.

In some embodiments of the vertical channel structure, the vertical channel film is connected at the proximal end to a second upper channel pad disposed on top of the stack. The second upper channel pad can be formed by selective epitaxy, forming a self-aligned pad of epitaxial silicon or other material, having a thickness greater than the thickness of the vertical channel film in the vertical channel structure. Also, the second upper channel pad, and one or both of the first mentioned upper channel pad and the lower channel pad can be formed in the same selective epitaxial growth process, whereby two self-aligned pads are formed on the proximal end of the vertical channel structure and one is formed on the distal end of the vertical channel structure.

As used herein, a "connection" or "connected" between the vertical channel films in a vertical channel structure and the pads refers to an electrical connection as by physical contact so that current suitable for operation of the memory passes from the vertical channel films through the pads.

In some embodiments, the upper and lower channel pads are conductively doped, including N+ doping (or P+) having a greater concentration of doping than the vertical channel film, which can be doped for operation as channels for the memory cells in the NAND strings.

In some embodiments, the memory may include one or more patterned conductor layers over the stack, including a source line, and an interlayer connector connecting the source line to the upper channel pad over the stack. In some embodiments, the memory may include one or more patterned conductor layers over the stack, including a bit line, and an interlayer connector connecting the bit line to the upper channel pad over the stack.

Methods for manufacturing memory devices with one or more vertical channel and one or more channel pads as described herein are also provided. In one embodiment, a method for manufacturing includes forming vertical channel films disposed on the sidewalls of the openings in the stack. The method for manufacturing further includes forming upper channel pads at the tops of stacks of conductive strips and lower channel pads in a lower level of the opening.

In an example described herein, a 3D memory device comprises a stack of conductive strips with an opening. A vertical channel structure is arranged in the opening, the vertical channel structure in contact with the data storage structure on the sidewalls of the openings. The vertical channel structure includes a first vertical channel film and a second channel film. Both the first and second channel films have proximal ends and distal ends. The first channel film is electrically connected at the proximal end to a first upper channel pad at the top of the stack, and the second channel film is electrically connected at the proximal end to a second upper channel pad at the top of the stack. The first and second vertical channel films are connected at the distal ends to a lower channel pad located in the lower region of the opening. The upper and lower channel pads comprise epitaxially grown semiconductor structures with thicknesses greater than that of the vertical channel films. The conductive strips in intermediate levels in the stack can be configured as word lines. The conductive strips in a lower level in the stack can be configured as inversion assist gate lines. The lower channel pad increases the conductivity of the vertical channel structure near the lower region. Furthermore, the lower channel pad enables the inversion assist gate lines to better control the conductivity near the bottom of the vertical channel structure.

In an example described herein, the memory device comprises an array or a string of NAND memory cells at cross-points between the vertical channel structure and conductive strips in intermediate levels in the stack configured as word lines. A top frustum of the memory device includes a first switch on the first side of the opening controlled by a signal on a top conductive strip in the stack, and a second switch on the second side of the opening controlled by a signal on a top conductive strip in the stack. The first switch (e.g., GSL) can be used to connect the NAND string to a common source line, or another reference line, and the second switch (e.g., SSL) can be used to connect the NAND string to a bit line, or other line coupled to sensing circuitry. The first upper channel pad over the stack provides a better connection for the vertical channel structure and the common source line or another reference line. The second upper channel pad over the stack provides a better connection for the vertical channel structure and the bit source line or other line coupled to sensing circuitry.

Other aspects and advantages of the present invention can be seen on review of the drawings, the detailed description, and the claims, which follow.

DETAILED DESCRIPTION

A detailed description of embodiments of the present invention is provided with reference to the FIGS. 1-18.

Figure 1:
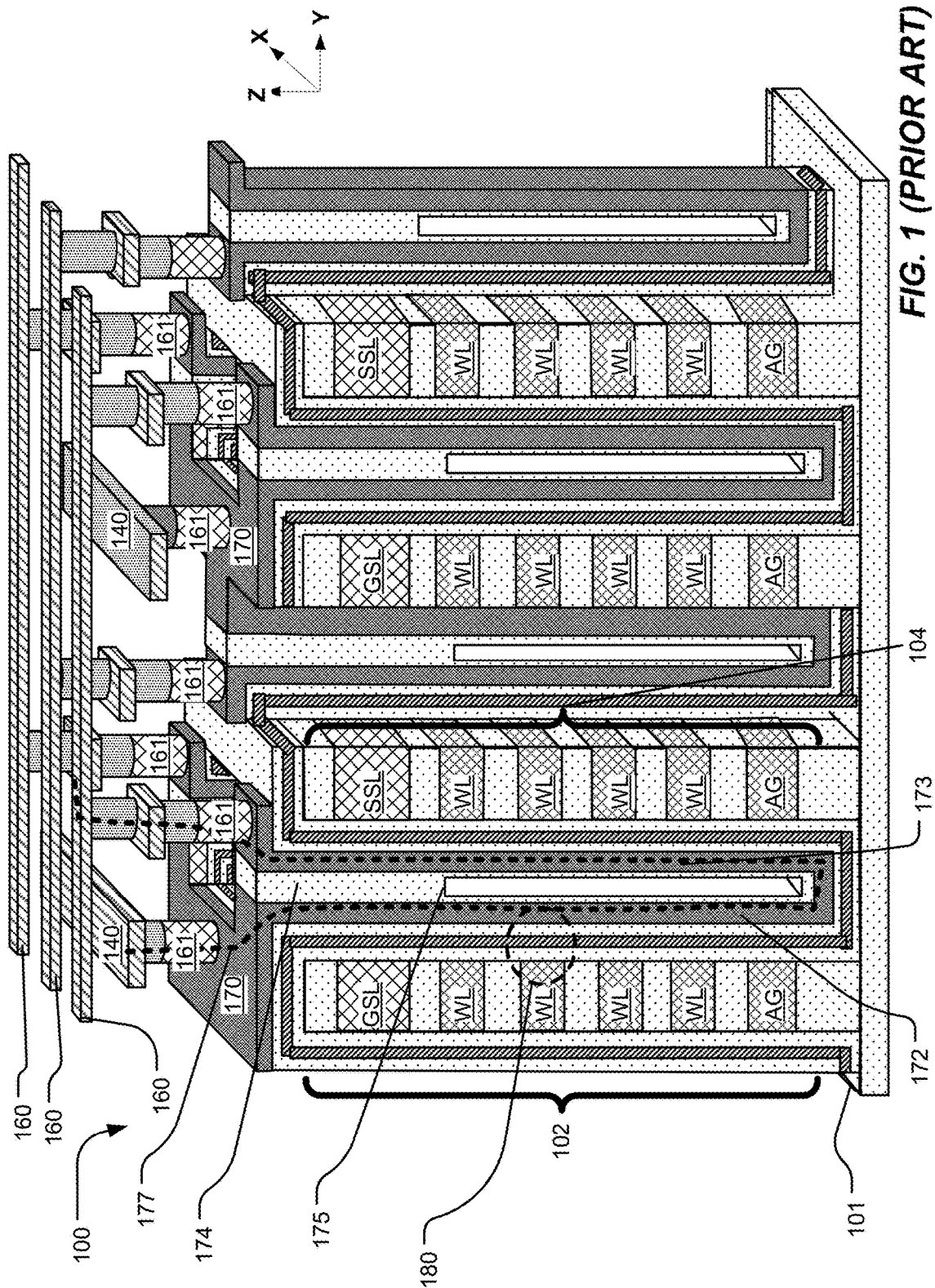
FIG. 1 is a simplified perspective diagram of a 3D memory device including a U-shaped thin-film structure according to the prior art.

FIG. 1 is a schematic diagram of a three-dimensional 3D memory device 100 having a U-shaped thin-film structure according to a 3D vertical channel technology as described in U.S. Pat. No. 9,524,980, showing connection techniques applied to thin-channel films in vertical channel structures of the prior art.

The memory device 100 includes an insulating substrate 101. A plurality of conductive layers on the insulating substrate 101 includes openings that form a plurality of stacks of conductive strips, including at least a top plane of conductive strips (ground select lines or GSLs, and string select lines or SSLs), a plurality of intermediate planes of conductive strips (world lines or WLs), and a bottom plane of conductive strips (assisted gate or AG). In the example shown in FIG. 1, a first stack 102 includes a bottom plane of conductive strips (AG), a plurality of intermediate planes of conductive strips (WLs), and a top plane of conductive strips (GSL). A second stack 104 includes a bottom plane of conductive strips (AG), a plurality of intermediate planes of conductive strips (WLs), and a top plane of conductive strips (SSL). Adjacent word lines in the first stack 102 and the second stack 104 are connected to separate bias circuits (not shown) so that two charge storage sites at the frustum of each vertical channel structure between the adjacent word lines can be separately accessed and used for data storage.

A u-shaped thin-film structure 170 is disposed between the first stack 102 and the second stack 104, and can comprise semiconductor materials adapted to act as channels for the memory cells. In the illustrated example, a plurality of patterned conductor layers, such as the bit line 160 and the common source line 140, are arranged orthogonally over the first and second stacks, and are connected to the plurality of first and second stacks, including the upper regions of the u-shaped thin-film structure 170 through interlayer connectors 161. The interlayer connectors 161 in this example comprise a semiconductor, such as polysilicon, formed by deposition in vias over the thin-film semiconductor used in formation of the vertical channel films. Thus, precise alignment of the vias used to form the connectors 161 is needed. Also an etch process to form the vias must avoid damage to the thin film on top of the stacks. Other difficulties can arise in establishing quality contacts.

The memory device includes data storage structures in interface regions at cross-points 180 between sidewalls of the first and second conductive strips in the plurality of intermediate planes (WLs) in the stacks and the u-shaped thin-film structure 170. The memory layer can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

A NAND string comprises the memory cells on opposing sides of the first and second stacks of conductive strips. The channel in the memory cells of the u-shaped thin-film structure 170 is comprised of respective thin films 172, 173 of semiconductor material separated by a gap 174 which acts as an insulating structure, or as part of an insulating structure between the thin films. The gap may enclose gas 175, such as gas from the atmosphere, in the chamber during formation. Thin films 172, 173 are connected at the bottom of the active pillar, and the circuit path 177 illustrates the current flow for a u-shaped NAND string between the common source line 140 and the bit line 160. The thin film at the bottom of the trench-shaped holes can have relatively high resistance, and otherwise suffer from reliability problems because of difficulty in maintaining uniformity at depth in the opening.

Figure 2:
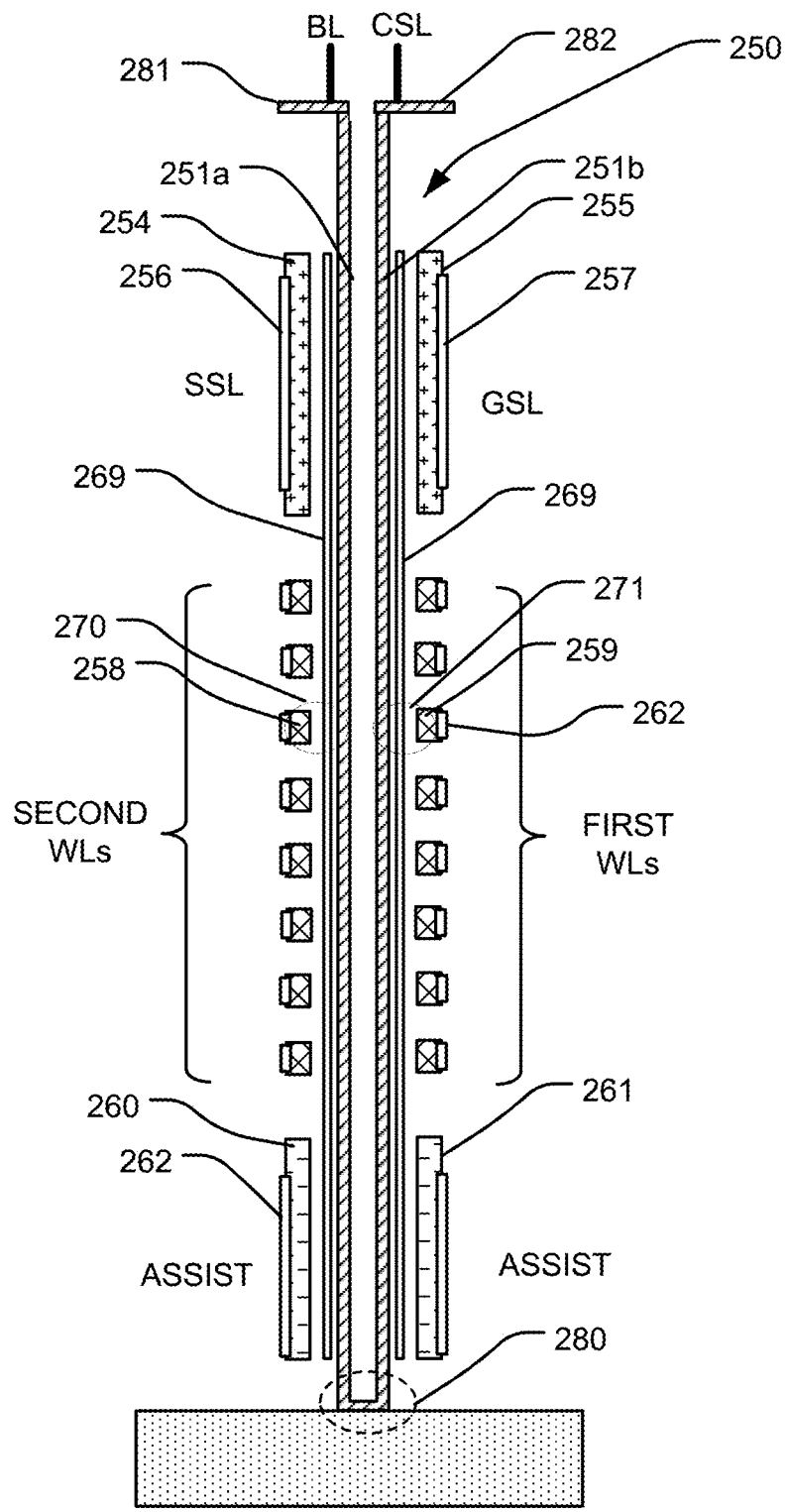
FIG. 2 is a heuristic cross-section of a U-shaped thin-film structure in the 3D memory device in FIG. 1.

FIG. 2 is a heuristic cross-section of a u-shaped thin-film structure 250 in the 3D memory device 100 in FIG. 1. The u-shaped thin-film structure 250 includes a vertical semiconductor body, including first and second vertical thin-channel films 251a and 251b along the length of the pillar, and is electrically connected at the bottom of the pillar. The thickness of the u-shaped thin-film structure 250 may be less than 20 nanometers and less than 10 nanometers for beneficial effects of thin-channel bodies in the memory cells along the entire length of the structure. A charge storage element 269 is disposed on each side of the pillar. The first thin-channel film 251a provides a channel body for a string select line transistor on one side and the second thin-channel film 251b provides a channel body for a ground select line transistor on the other side. The thin-channel films 251a, 251b are connected at the bottom of the u-shaped thin-film structure 250. FIG. 2 illustrates conductive strips 254 and 255 configured as a string select line and a ground select line, respectively, both in the upper level of the stacks of conductive strips. The select line conductive strips 254 and 255 can include a more highly conductive film 256, 257 on the outside surfaces, such as a film of a metal silicide. FIG. 2 also illustrates assist gate lines 260 and 261 which can be implemented as conductive strips in the stacks. The assist gate lines 260, 261 can include more highly conductive films 262 on the outside surfaces, such as a film of metal silicide. Conductive strips are disposed as first and second word lines on opposing sides of the U-shaped thin-film structure 250.

Thus, a first word line 259 is disposed opposite a second word line 258 in the structure. Eight word line layers are illustrated in this example. The structure illustrated in FIG. 2 provides memory cells 270, 271, having independent charge storage sites on the first and second sides of the u-shaped thin-film structure 250. Also, the structure supports operating a single u-shaped NAND string extending along the opposing sides of the u-shaped thin-film structure 250.

In the illustration of FIG. 2, the thickness in the vertical dimension of the word lines, the string select lines, and the ground select lines determines the channel lengths of the string select transistor, the memory cells, and the ground select transistors. The string and ground select line conductive strips 254, 255 in the structure of FIG. 3 have substantially greater thickness than the word line conductive strips. This greater channel length facilitates operating the string select transistor using a bias voltage on one side of the vertical channel structure which is sufficient to turn off the transistor, even when the bias voltage on the opposite side might otherwise be sufficient to turn it on.

The assist gate lines 260, 261 in the structure illustrated in FIG. 2 also have substantially greater thickness than the word lines. The region of the u-turn 280 in the u-shaped thin-film structure 250 is below the assist gate lines 260, 261.

A common source line structure, such as a line in a patterned metal layer, can be arranged orthogonally over the first and second stacks of conductive strips and connected to the u-shaped thin-film structure 250 at the landing 282. A bit line structure, such as a line in a patterned metal layer, can be arranged orthogonally over the first and second stacks of conductive strips and connected to the u-shaped thin-film structure 250 at the landing 281. Common source line landing 282 and bit line landing 281 can be formed by the thin film deposition process used to make the channel films in the u-shaped thin-film structure 250, which can be less than 20 nanometers. Such thin landing pads present manufacturing problems, and can result in a poor electrical connection to the overlying patterned conductors, including the common source line or the bit line.

Figure 3:
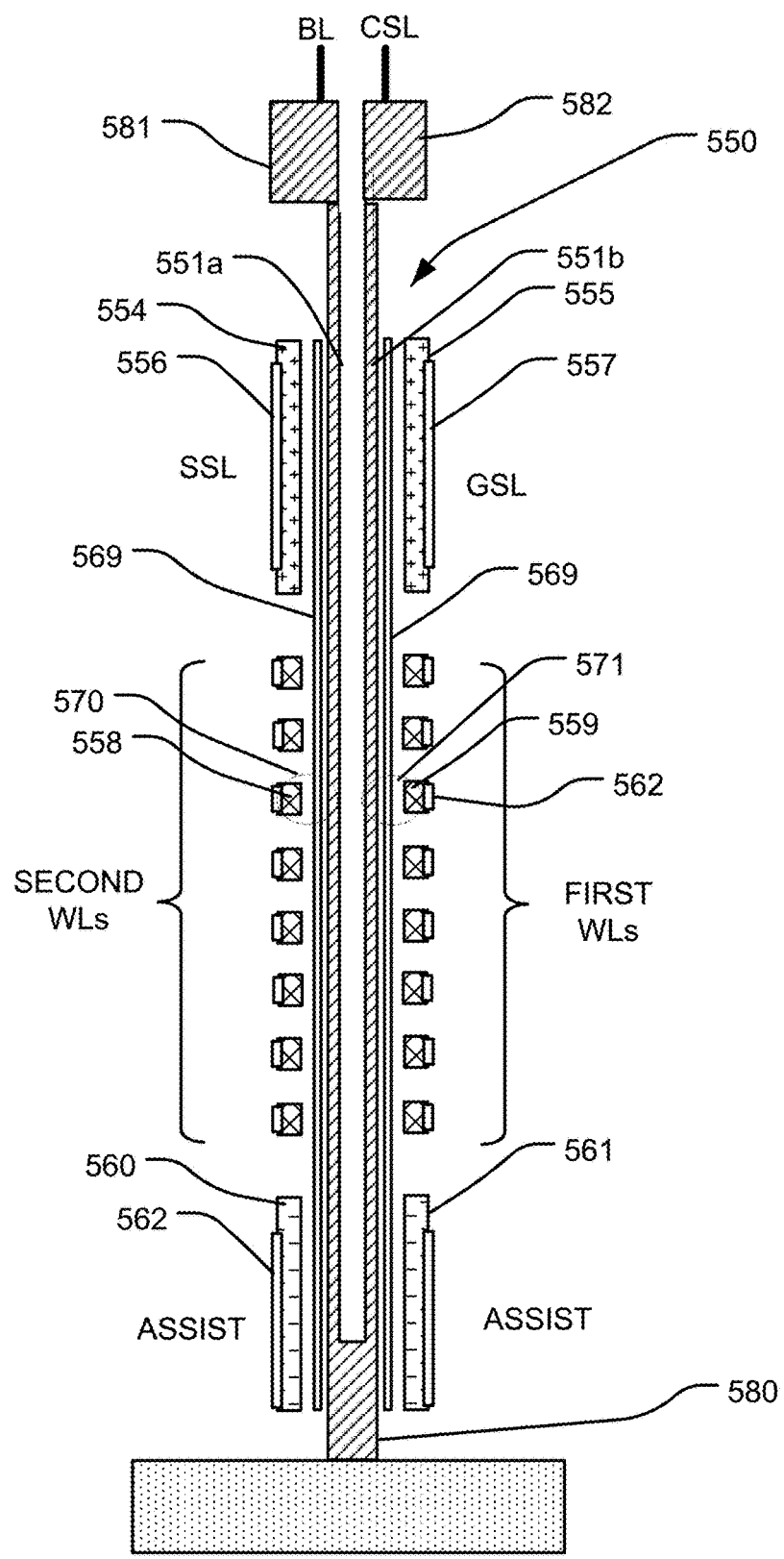
FIG. 3 is a heuristic cross-section of a vertical channel structure including two vertical channel films, two upper channel pads and a lower channel pad in a 3D memory device, as described herein.

FIG. 3 is a cross-section of a vertical channel structure 550 including two vertical channel films, two upper channel pads formed by selective epitaxy and a lower channel pad by selective epitaxy in a 3D memory device, according to one embodiment. The vertical channel structure 550 can include a first vertical channel film 551b and a second vertical channel film 551a. The first vertical channel film 551b is connected at the proximal end to a first upper channel pad 582. The second vertical channel film 551a is connected at the proximal end to a second upper channel pad 581. The first vertical channel film 551b and the second vertical channel film 551a are connected at the distal end to a lower channel pad 580. The first upper channel pad 582, the second upper channel pad 581 and the lower channel pad 580 may comprise self-aligned, epitaxially grown semiconductor structures with thicknesses greater than that of the vertical channel films. Using the self-aligned process to increase the thickness of the landing areas for the upper pads and to improve the connection structure in the lower levels of the vertical channel structure can improve the reliability and performance of the NAND strings.

A charge storage element 569 is disposed on each side of the pillar. The first vertical channel film 551b provides a channel body for a string select line transistor on one side and the second vertical channel film 551a provides a channel body for a ground select line transistor on the other side.

FIG. 3 illustrates conductive strips 554 and 555 configured as a string select line and a ground select line, respectively, both in the upper level of the stacks of conductive strips. The select line conductive strips 554 and 555 can include a more highly conductive film 556, 557 on the outside surfaces, such as a film of a metal silicide. FIG. 3 also illustrates assist gate lines 560 and 561 which can be implemented as conductive strips in the stacks. The assist gate lines 560, 561 can include more highly conductive films 562 on the outside surfaces, such as a film of metal silicide. Conductive strips are disposed as first and second word lines on opposing sides of the vertical channel structure 550. Thus, a first word line 559 is disposed opposite a second word line 558 in the structure. Eight word line layers are illustrated in this example. The structure illustrated in FIG. 3 provides memory cells 570, 571 having independent charge storage sites on the first and second sides of the vertical channel structure 550. Also, the structure supports operating a single u-shaped NAND string extending along the opposing sides of the vertical channel structure 550.

In the illustration of FIG. 3, the thickness in the vertical dimension of the word lines, the string select lines, and the ground select lines determines the channel lengths of the string select transistor, the memory cells, and the ground select transistors. The string and ground select line conductive strips 554, 555 in the structure of FIG. 3 have substantially greater thickness than the word line conductive strips. The resulting greater channel length facilitates operating the string select transistor using a bias voltage on one side of the vertical channel structure which is sufficient to turn off the transistor, even when the bias voltage on the opposite side might otherwise be sufficient to turn it on. The assist gate lines 560, 561 in the structure illustrated in FIG. 3 also have substantially greater thickness than the word lines.

The first upper channel pad 582 over the first stack provides a better connection for the vertical channel structure 550 and the common source line. The second upper channel pad 581 over the second stack provides a better connection for the vertical channel structure 550 and the bit source line. The lower channel pad 580 at the bottom of the vertical channel structure can overlap with the assist gate lines, thereby in combination with the assist gate lines to improve the conductivity near the lower regions of the vertical channel structures.

The first vertical channel film 551b and the second vertical channel film 551a can comprise semiconductor materials adapted to act as channels for the memory cells, such materials as Si, Ge, SiGe, GaAs, SiC, and graphene. The first upper channel pad 582, the second upper channel pad 581 and the lower channel pad 580 can comprise semiconductor materials, such as Si, polysilicon, Ge, SiGe, GaAs, and SiC, that can be epitaxially grown. The first upper channel pad 582, the second upper channel pad 581 and the lower channel pad 580 may further comprise a semiconductor, such as polysilicon, having a relatively high doping concentration so that they have higher conductivity than the first vertical channel film 551b and the second vertical channel film 551a.

Therefore, 3D memory devices with vertical channel structures are disclosed, the vertical channel structures including one or more vertical channel films and at least one or more channel pads. The channel pads in the vertical channel structure may be upper channel pads or lower channel pads. The upper channel pads are connected to the vertical channel films at the proximal ends. The lower channel pads are connected to the vertical channel films at the distal ends. In some embodiments, the upper and lower channels pads may have higher doping concentrations than the vertical channel films, thereby enabling the channel pads to have a lower resistance than the vertical channel films. The upper channel pads may act as thicker, low-resistance landing pads for any patterned conductor layers over the 3D memory device. The lower channel pads located near the lower regions of the vertical channel structures may enable the assist gate lines to have better modulation of the conductivity of the lower regions. The lower channel pads may also reduce the resistance of the lower regions of the vertical channel structures due to greater doping and a more reliable formation processes.

Figure 4:
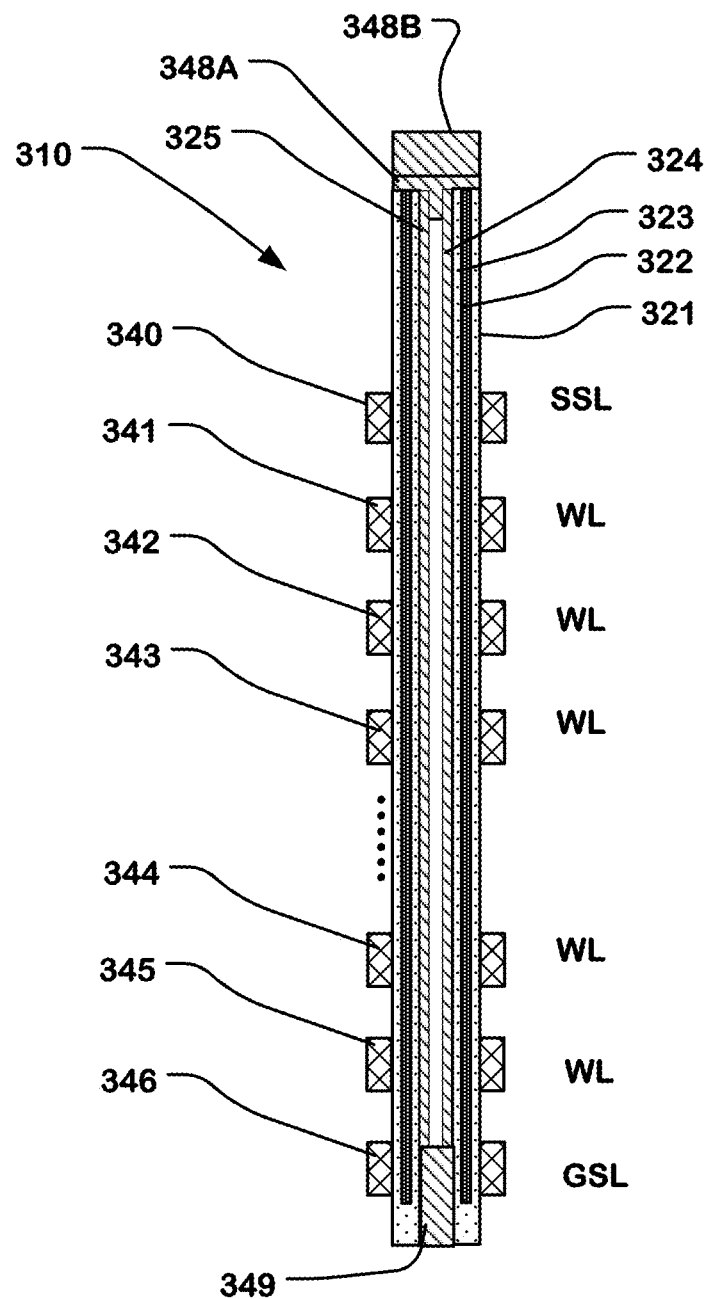
FIG. 4 is a heuristic cross-section of a vertical channel structure including two vertical channel films, an upper channel pad and a lower channel pad in a 3D memory device, according to one embodiment.

The technology can be utilized in other vertical channel structures as well. FIG. 4 is a heuristic cross-section of a vertical channel structure for a vertical NAND string including two vertical channel films, an upper channel pad and a lower channel pad in a 3D memory device, according to an alternative gate-all-around NAND string configuration. The 3D memory in FIG. 3 includes a plurality of lower select lines as described herein. The vertical channel structure 310 is disposed in an opening that penetrates a plurality of levels, where each level includes a corresponding conductive strip (340, 341, 342, 343, 344, 345, 346) including strips configured as select lines (345, 346) or word lines (340, 341, 342, 343, 344) separated from other conductive strips by insulating material. The conductive strips can comprise polysilicon, tungsten, or other conductive semiconductor or metal or metal alloy, a metal compound, or combinations of conductive materials, as suits a particular embodiment. The insulating material is not represented to avoid crowding in the figure. The depth of the opening in which the vertical channel structure 310 is implemented can be significant, such that there may be 16, 32, 64 or more levels in a given implementation.

The vertical channel structure 310 as illustrated in cross-section includes a first vertical channel film 324 on one side of the hole-shaped opening and a second vertical channel film 325 on the other side of the hole-shaped opening. The films 324 and 325 can comprise a single cylindrical film. Also the films 324 and 325 are connected at the top and bottom. The first vertical channel film 324 and the second vertical channel film 325 merge and overlie the stack in region 348A, and act as a seed for epitaxial growth on the proximal end of upper channel pad 348B. The upper channel pad 348B is electrically connected to a bit line (not shown). The first vertical channel film 324 and the second vertical channel film 325 are also connected to epitaxially grown, lower channel pad 349. The lower channel pad 349 is electrically connected to a reference line, such as a common source line (not shown).

The vertical channel films in this example comprise semiconductor materials adapted to act as channels for the memory cells, such materials as Si, Ge, SiGe, GaAs, SiC, and graphene. The upper and lower channel pad in FIG. 3 can comprise semiconductor materials, such as Si, polysilicon, Ge, SiGe, GaAs, and SiC, that can be epitaxially grown. The upper and lower channel pads may further comprise a doped semiconductor, such as epitaxial silicon, having a relatively high doping concentration so that they have higher conductivity than the vertical channel films.

The 3D memory comprises a data storage layer which lines the sidewalls of the conductive strips within the opening, forming memory cells at cross-points of conductive strips used as word lines with the vertical channel structure 310. The data storage layer in this example comprises a blocking dielectric layer 321, a dielectric charge trapping layer 322, and a tunneling dielectric layer 323. Other types of data storage layers can be utilized as well.

In this embodiment, the conductive strip 340 in an upper level (the uppermost level in this example) is configured to be part of an upper select line, referred for the purposes of this example as a string select line SSL, for the vertical channel structure, whereby an upper select gate transistor is formed at the frustum in the cross-point of the conductive strip 340 and the vertical channel structure 310. The conductive strip is configured to be part of a string select line by connection to electrical routing to a decoded driver circuit for controlling operation of the upper select gate. The gate dielectric for the upper select gate transistor in this example is formed by the data storage layer (321, 322, 323). During manufacturing or configuration of the NAND string, the data storage layer for the upper select gate transistor may be set to a low threshold state so that it acts as a switch for connecting the NAND string to the corresponding bit line. In alternative embodiments, the gate dielectric can be implemented using a single layer of oxide for example or other gate dielectric material that does not tend to store charge.

Conductive strips (341, 342, 343, 344, 345) in the intermediate levels are configured to be part of word lines. These conductive strips are configured to be part of word lines by connection to electrical routing to word line drivers. Memory cells are disposed by the structure at the frustums of the vertical channel structure 310 at cross-points with the conductive strips (341-344) configured to be part of word lines.

A conductive strip 346 in a lower level is configured to be part of a lower select line, referred to for the purposes of this example as a ground select line GSL, for the vertical channel structure, whereby a lower select gate transistor is formed at the frustum in the cross-point of the conductive strip 346 and the vertical channel structure 310. The gate dielectric for the lower select gate transistor in this example is formed by an insulator, as illustrated, between the lower channel pad 349 at the bottom of the vertical channel structure and the conductive strip 346. The lower select gate transistor acts as a switch for connecting the NAND string to the corresponding reference line.

Figure 5:
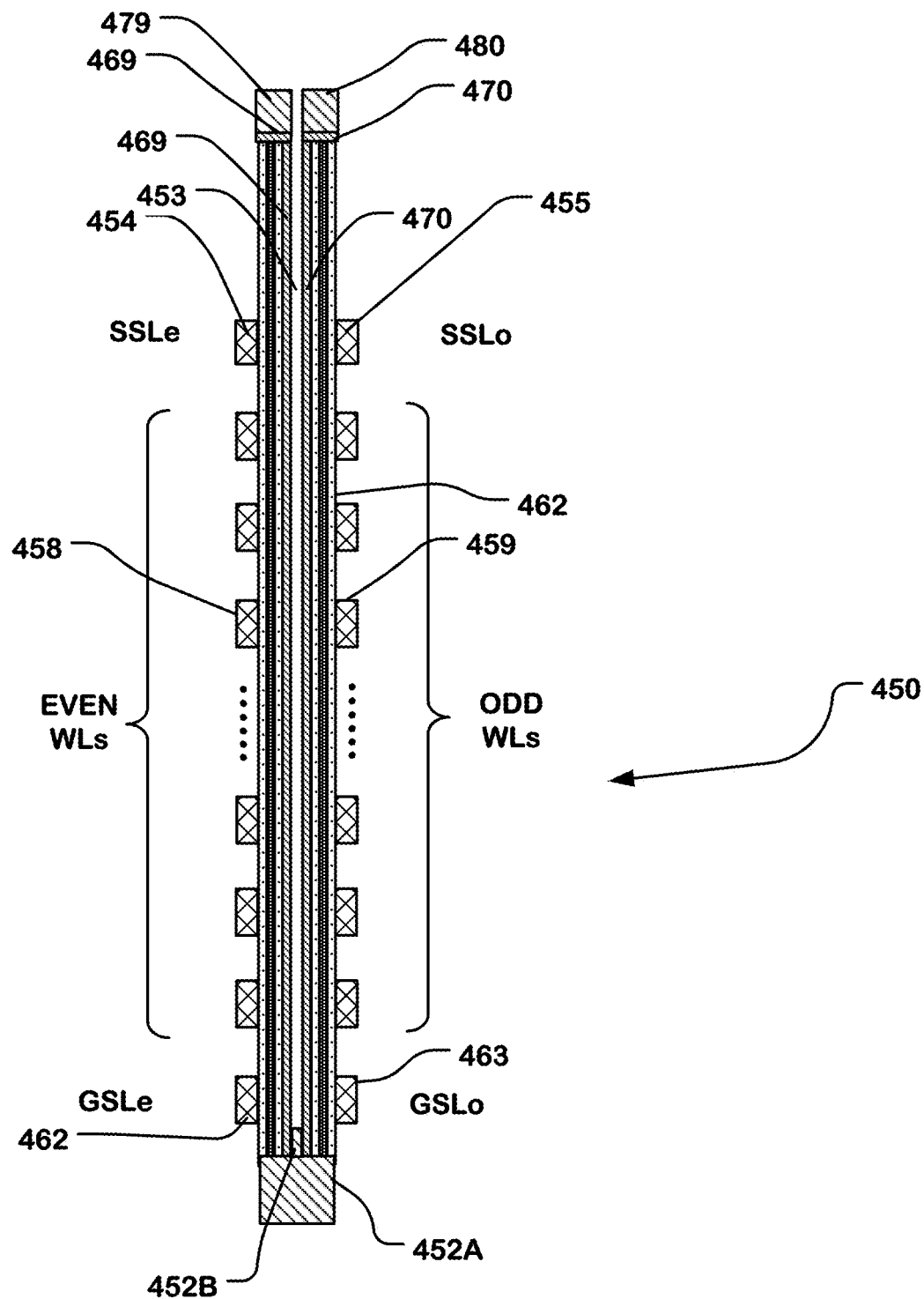
FIG. 5 is a heuristic cross-section of a vertical channel structure including two vertical channel films and a lower channel pad in a 3D memory device, according to one embodiment.

FIG. 5 is a cross-section of an alternative vertical channel structure 450 supporting even and odd NAND strings. The vertical channel structure 450 has memory cells on two sides, and conductive strips configured as even and odd string select lines SSLe, SSLo, even and odd ground select lines GSLe, GSLo, even word lines and odd word lines.

The vertical channel structure 450 in FIG. 5 includes a vertical polysilicon semiconductor body including an even vertical channel film 470 and an odd vertical channel film 469 separated by a seam 453. The even vertical channel film 470 and the odd vertical channel film 469 are connected at the distal end to a reference line conductor 452A. Also, a lower channel pad 452B comprising an epitaxial semiconductor, such as epitaxial silicon grown by self-aligned selective epitaxy as discussed above, is disposed between the even vertical channel film 470 and the odd vertical channel film 469 in the lower levels of the opening. The 3D memory device includes charge storage elements on each side of the semiconductor body, which can be continuous on the sidewalls of the stacks as shown, or separated into separate elements on the sidewalls of the conductive layers in the stacks which act as word lines.

The vertical channel structure 450 includes a portion providing a vertical channel body for string select line transistors adjacent the SSLe and SSLo conductive strips, and a portion which incorporates the reference conductor through the lower channel pad 452B. Between the portions of the vertical channel structure which contact or incorporate the lower channel pad 452B, the seam 453 is disposed within the vertical channel structure 450 between the even and odd word lines. The seam 453 separates the even vertical channel film 470 and the odd vertical channel film 469 bodies at the frustum of the column (e.g., at the level of even word line 458 and odd word line 459) at which the word lines cross, in the regions of the conductive strips configured as word lines, providing thin-channel films for the memory cells.

FIG. 5 illustrates conductive strips 454 and 455 configured as string select lines. The string select line conductive strips 454 and 455 can include a more highly conductive film on the outside surfaces, such as a film of a metal silicide. The channel films 469 and 470 in the vertical channel structure in this example overlie the top of the structure, forming a basis for epitaxial growth of first and second upper channel pads 479 and 480. The first and second upper channel pads 479 and 480 can comprise epitaxial semiconductor, such as epitaxial silicon grown by self-aligned selective epitaxy as discussed above.

FIG. 5 also illustrates conductive strips 462, 463 in a lower level configured as even and odd ground select lines GSLe, GSLo. The ground select lines 462, 463 can include more highly conductive films on the outside surfaces, such as a film of metal silicide. Likewise, conductive strips in intermediate levels are disposed as even and odd word lines on opposing sides of the vertical channel structure 450. Thus, an even word line 458 is disposed opposite an odd word line 459 in the structure. A smaller or larger number of word line layers, such as 4, 16, 32, or more can be utilized. Also, in some embodiments, dummy word lines may be included, in addition to those used for actual data storage. In other embodiments, all or some of the string select lines, word lines and ground select lines are implemented using metal, or other conductive material, rather than polysilicon.

The structure illustrated in FIG. 5 comprises first and second NAND strings on opposing sides of the vertical channel structure 450. Using the structure of FIG. 5, a memory device is provided, comprising a plurality of stacks of conductive strips, the plurality of stacks including even stacks and odd stacks; a plurality of vertical channel structures arranged between corresponding even and odd stacks of conductive strips in the plurality of stacks with even and odd upper channel pads, vertical channel structures in the plurality comprising even and odd vertical thin-channel films, and lower channel pads.

The even and odd vertical channel films in FIG. 5 can comprise semiconductor materials adapted to act as channels for the memory cells, such materials as Si, Ge, SiGe, GaAs, SiC, and graphene.

FIGS. 6 through 14 illustrate an example process flow for a 3D memory device with vertical channel films and channel pads for a structure like that of FIG. 3.

Figure 6:
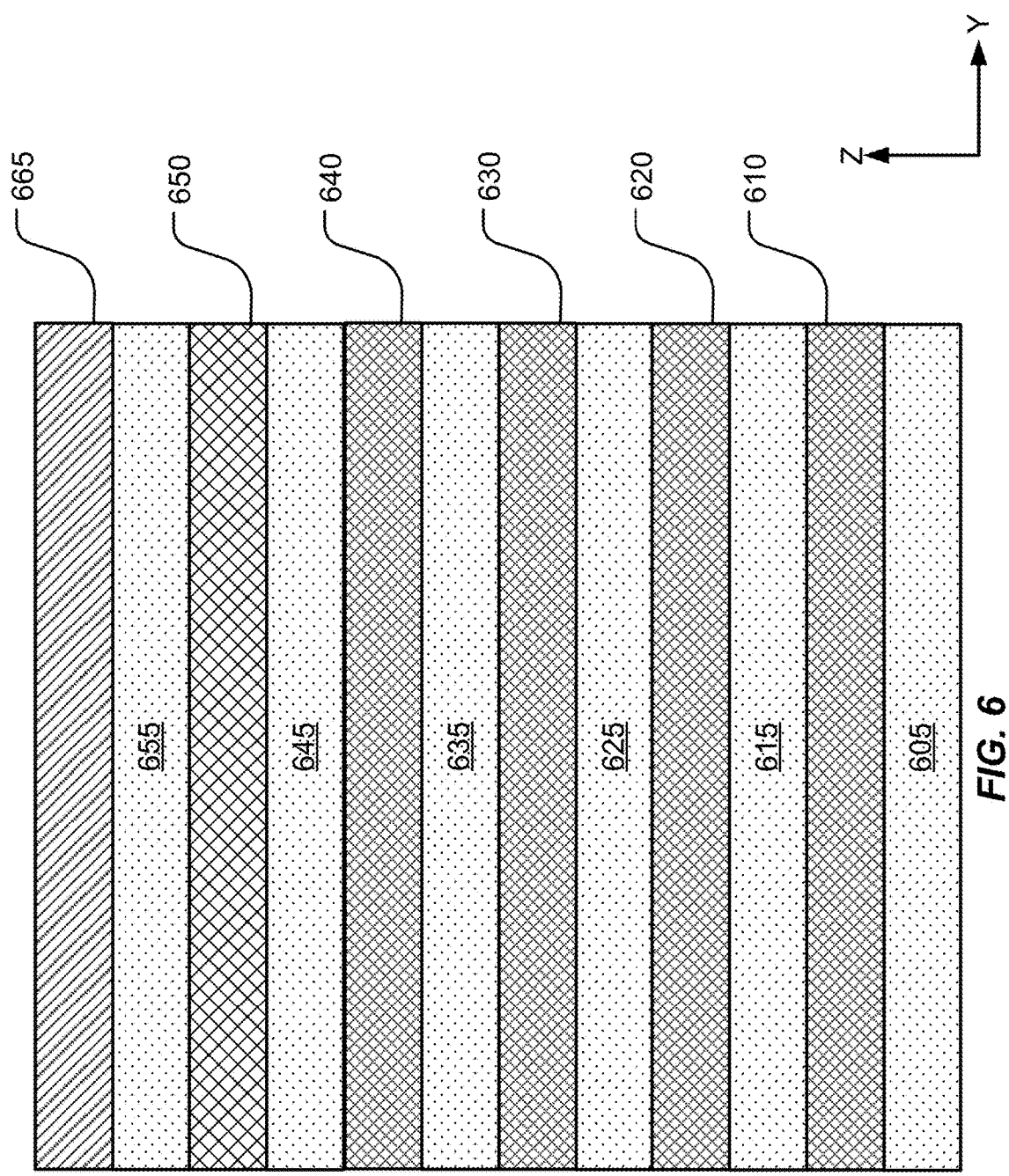
FIGS. 6, 7, 8, 9, 10, 11, 12, 13 and 14 illustrate structures during manufacturing stages for a 3D memory with a vertical channel structure as described herein, like that of FIG. 3.

FIG. 6 illustrates a stage of the process flow after forming a plurality of conductive layers on top of an insulating layer 605 which can comprise silicon oxide or another dielectric on a semiconductor substrate. To form the structure shown in FIG. 6, a plurality of layers 610, 620, 630, 640, 650 of a first conductive material, such as doped polysilicon, or other material suitable for use as word lines, separated by layers 615, 625, 635, 645, 655 of insulating material, are disposed over the insulating layer 605. A top layer 665 of silicon nitride is disposed on the plurality of conductive and insulating layers. In embodiments described herein, the conductive material can be a heavily p-type doped polysilicon (P+ polysilicon) or other material selected for compatibility with the data storage structures. The layer of silicon nitride can be used to provide tensile stress. The silicon nitride layer can improve the uniformity of the stacks and reduce bending during high aspect ratio etching. The layers of insulating material can comprise silicon dioxide deposited in a variety of ways as known in the art. Also, the layers of insulating material can comprise other insulating materials, and combinations of insulating materials. In this example, all of the insulating layers, with the exception of the top layer 665, consist of the same material. In other examples, different materials can be used in different layers as suits a particular design goal. After the plurality of layers is formed, a patterned etch is applied to form a plurality of stacks of conductive strips and openings.

Figure 7:
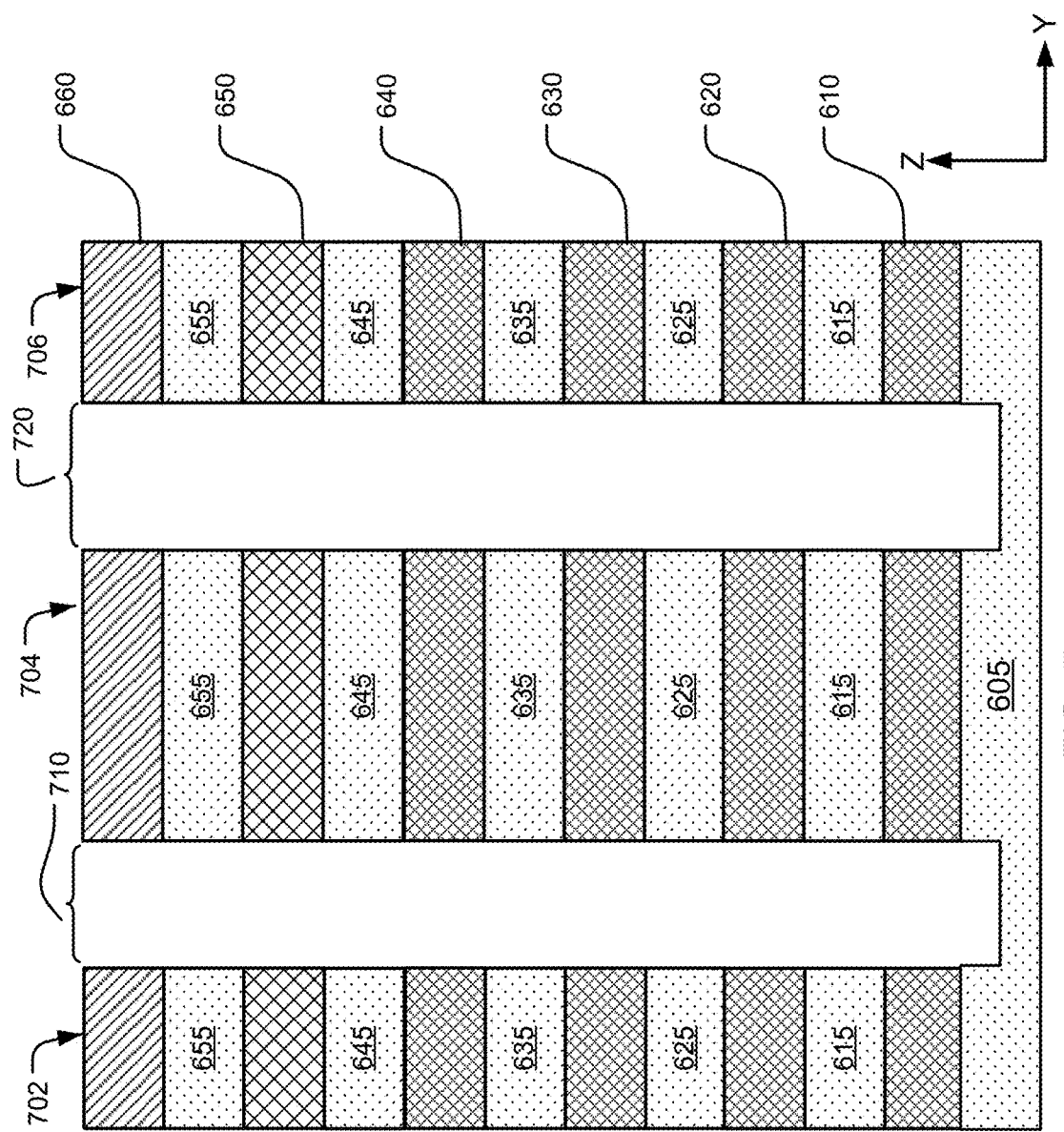

FIG. 7 illustrates a stage of the process after etching the plurality of layers, and stopping below the top surface of the insulating layer 605 to define a plurality of stacks of conductive strips, including stacks 702, 704 and 706. The stacks 702, 704 and 706 include at least a lower (e.g. bottom) level (AG) of conductive strips 610, a plurality of intermediate levels (WLs) 620, 630, 640 of conductive strips, and an upper (e.g. top) level 650 of conductive strips (SSL/GLS) as labeled in stack 706. A top layer 660 of silicon nitride strips is disposed on each stack. The stacks 702, 704 and 706 include layers 615, 625, 635, 645, 655 of insulating material separating the conductive strips from one another.

The etching process further defines openings 710 and 720. The opening may be a trench or a hole. For the purpose of this application, a process flow is shown where the etching process defines one or more trenches. However, the technology disclosed herein can also be formed in a hole opening. In the example illustrated in FIG. 7, the opening may be for example 70 to 120 nm wide.

Figure 8:
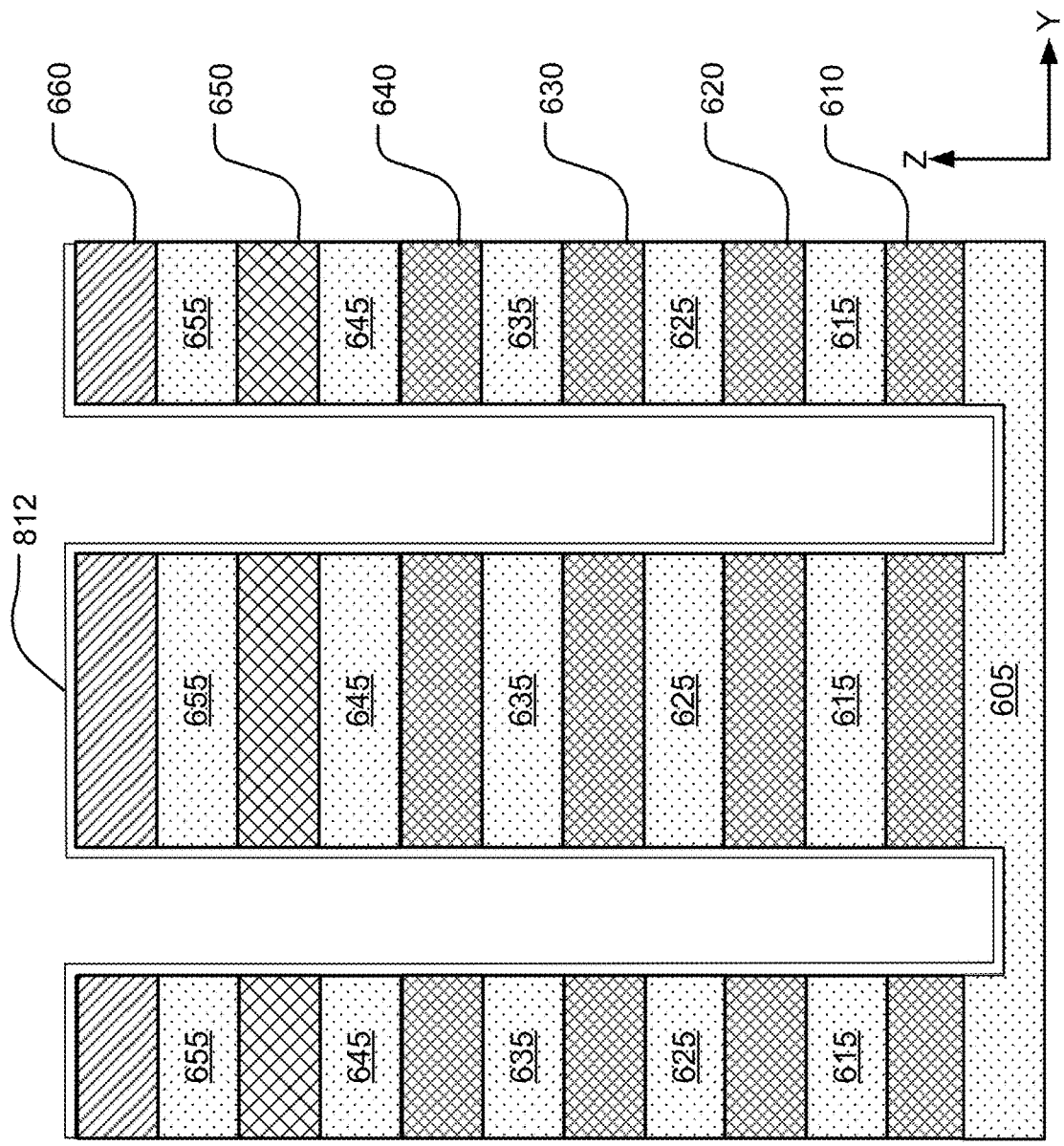

FIG. 8 illustrates a stage of the process flow after forming a memory layer 812 over and on sides of conductive strips in the plurality of stacks. The memory layer contacts side surfaces of the plurality of conductive strips. The memory layer can comprise a multilayer data storage structure including a tunneling layer, a charge storage layer, and a blocking layer, examples of which are discussed above.

Figure 9:
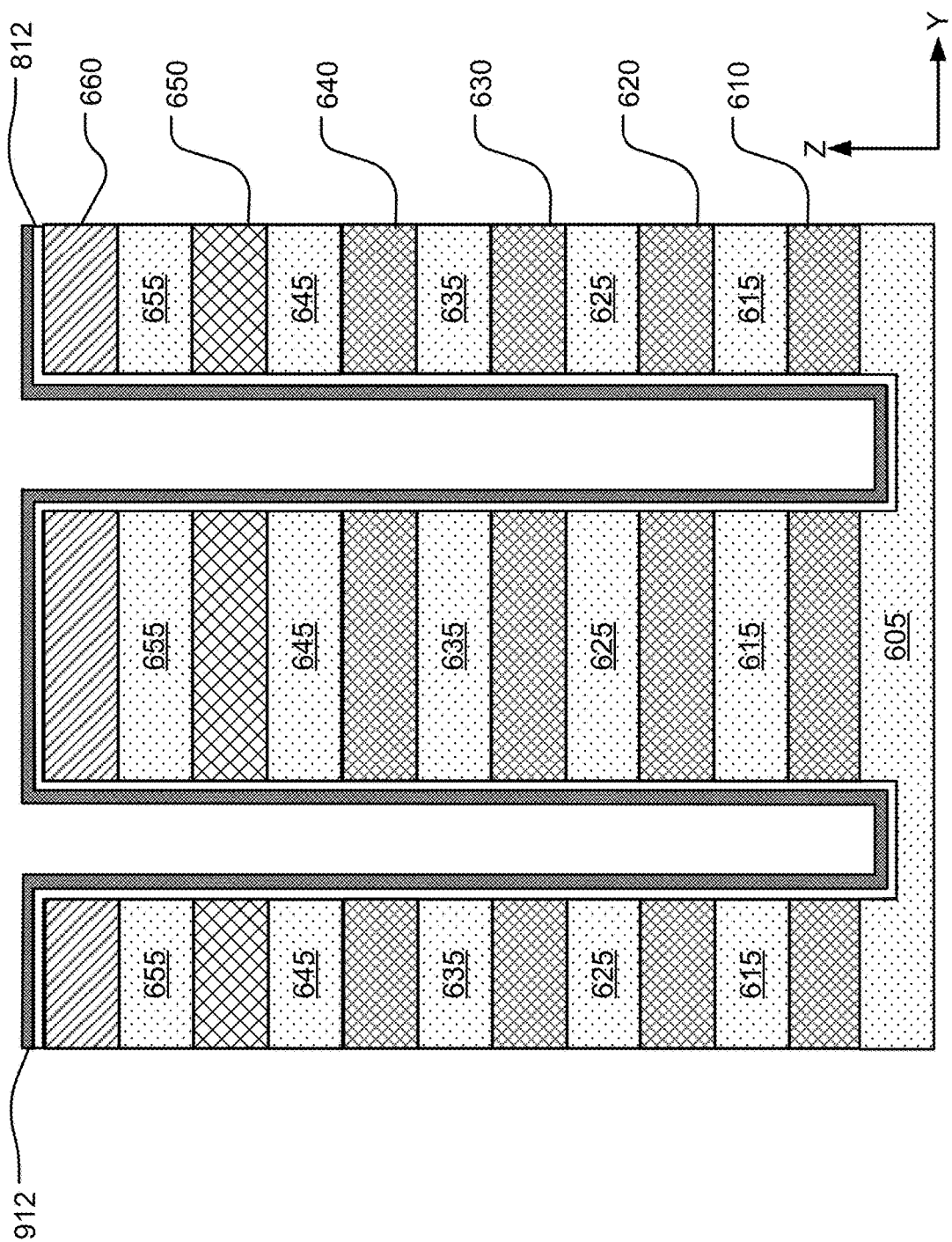

FIG. 9 illustrates a stage of the process flow after forming a first semiconductor layer 912 over and having a surface conformal with the memory layer on the plurality of stacks. In the dielectric charge storage embodiment, the first semiconductor layer 912 contacts the memory layer 812 at least in the regions in which memory cells are being formed. The semiconductor material in the first semiconductor layer 912 comprises a semiconductor adapted by choice of material, e.g., silicon, and doping concentrations (e.g., undoped or lightly doped) to act as channel regions for vertical strings of memory cells, at least in the regions between the stacks so as to form channel films on the sidewalls of the opening. The first semiconductor layer 912 can have a thickness of about 10 nanometers or less. As illustrated in FIG. 9, in the regions between the stacks, the first semiconductor layer 912 extends to the bottom of the openings between the stacks, and overlies the memory layer 812.

Figure 10:
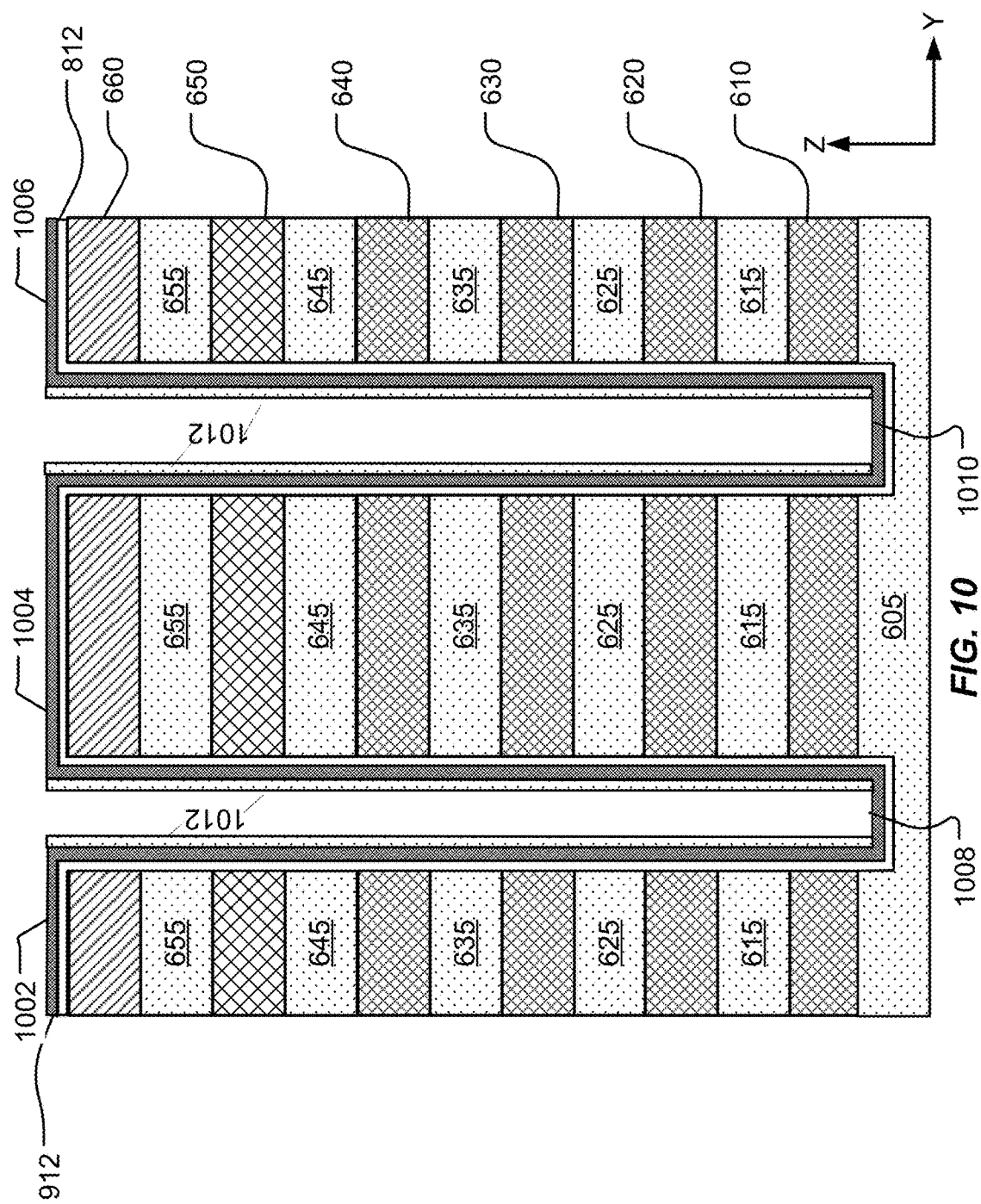

FIG. 10 illustrates a stage in the process flow after performing a step to form masks 1012 on the sidewalls of the stacks next to the first semiconductor layer 912. The masks 1012 may comprise an oxide, e.g., silicon oxide, or a semiconductor, e.g., silicon nitride suitable to act as a mask during epitaxial growth. The masks 1012 may be formed by depositing a layer of silicon oxide or silicon nitride over and having a surface conformal with the first semiconductor layer on the plurality of stacks, followed by a spacer etch (anisotropic etch) to form a spacer structure on the sidewall. The spacer structures form the masks 1012, exposing areas 1002, 1004, 1006, 1008, 1010 to expose seed layer for self-aligned epitaxial growth to form semiconductor pads.

Figure 11:
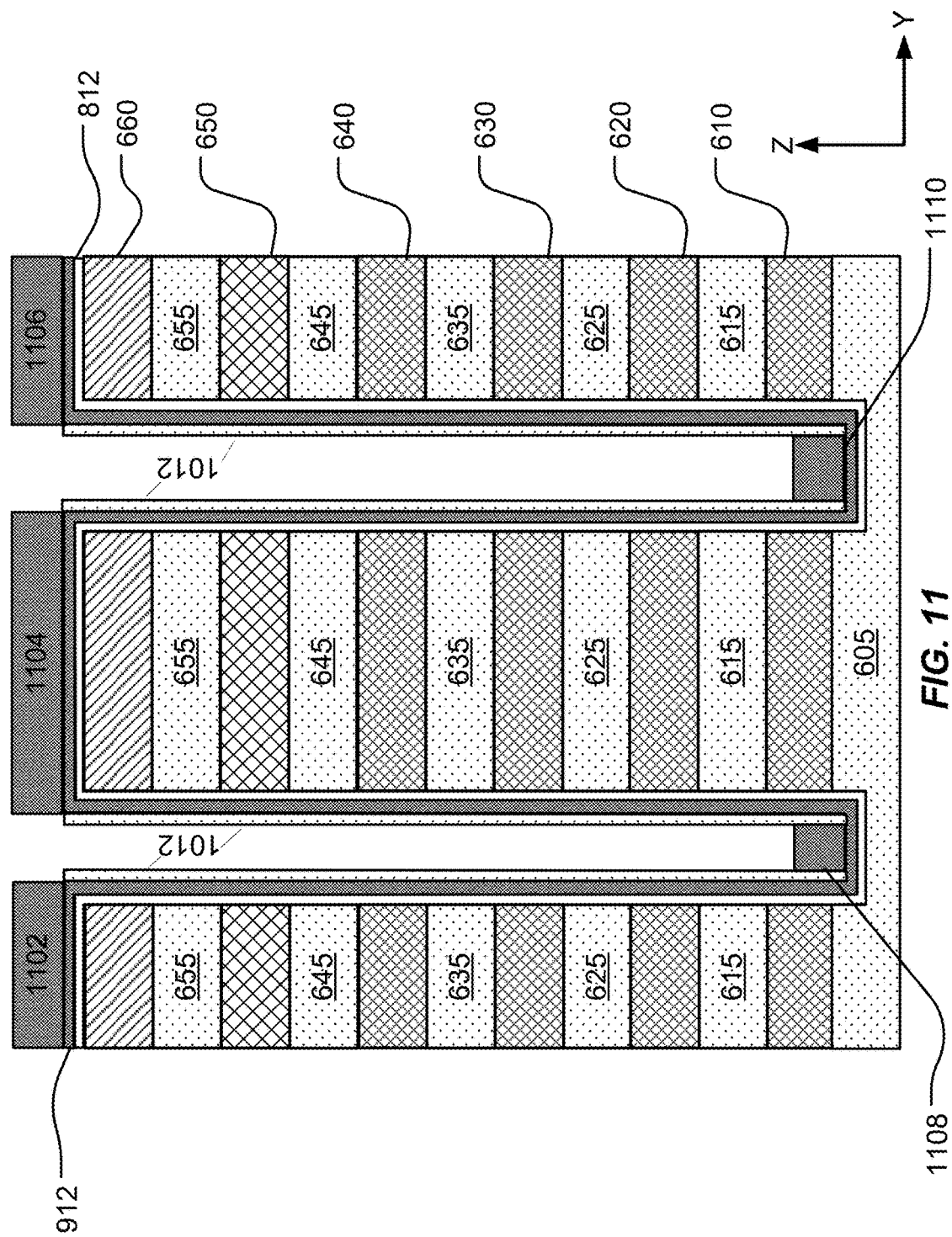

FIG. 11 illustrates a stage in the process after growing semiconductor pads on the areas 1002, 1004, 1006, 1008 and 1010 exposed by the masks 1012. The semiconductor pads 1102, 1104, 1106, 1108 and 1110 are grown through a self-aligned, selective epitaxy of silicon seeded by the semiconductor layer 912 in the exposed areas 1002, 1004, 1006, 1008 and 1010. Selective epitaxial growth is a technique for epitaxially growing a semiconductor material on a semiconductor substrate in a desired, seeded area. The desired, seeded areas are generally exposed by dielectric masks. Semiconductor growth conditions are selected to ensure epitaxial growth on the exposed areas, but not on the dielectric masks. Epitaxial growth is initiated selectively in the seed windows on the exposed areas. The growth is referred to as Selective Epitaxial Growth (SEG).

In one embodiment, the semiconductor pads may have thicknesses greater than 20 nanometers and can be for example between 20 and 150 nanometers, and preferably 40 to 70 nanometers after SEG. The thicknesses of the upper pads can be different than the thickness of the lower pads due to the dynamics of SEG on the upper surface as compared to deep in the opening. In one embodiment, the semiconductor pads may comprise semiconductor materials, such as Si, polysilicon, Ge, SiGe, GaAs, and SiC, that can be epitaxially grown. In one embodiment, the semiconductor pads may comprise a semiconductor, such as polysilicon, having a relatively high doping concentration so that they have higher conductivity than the first semiconductor layer 912.

Figure 12:
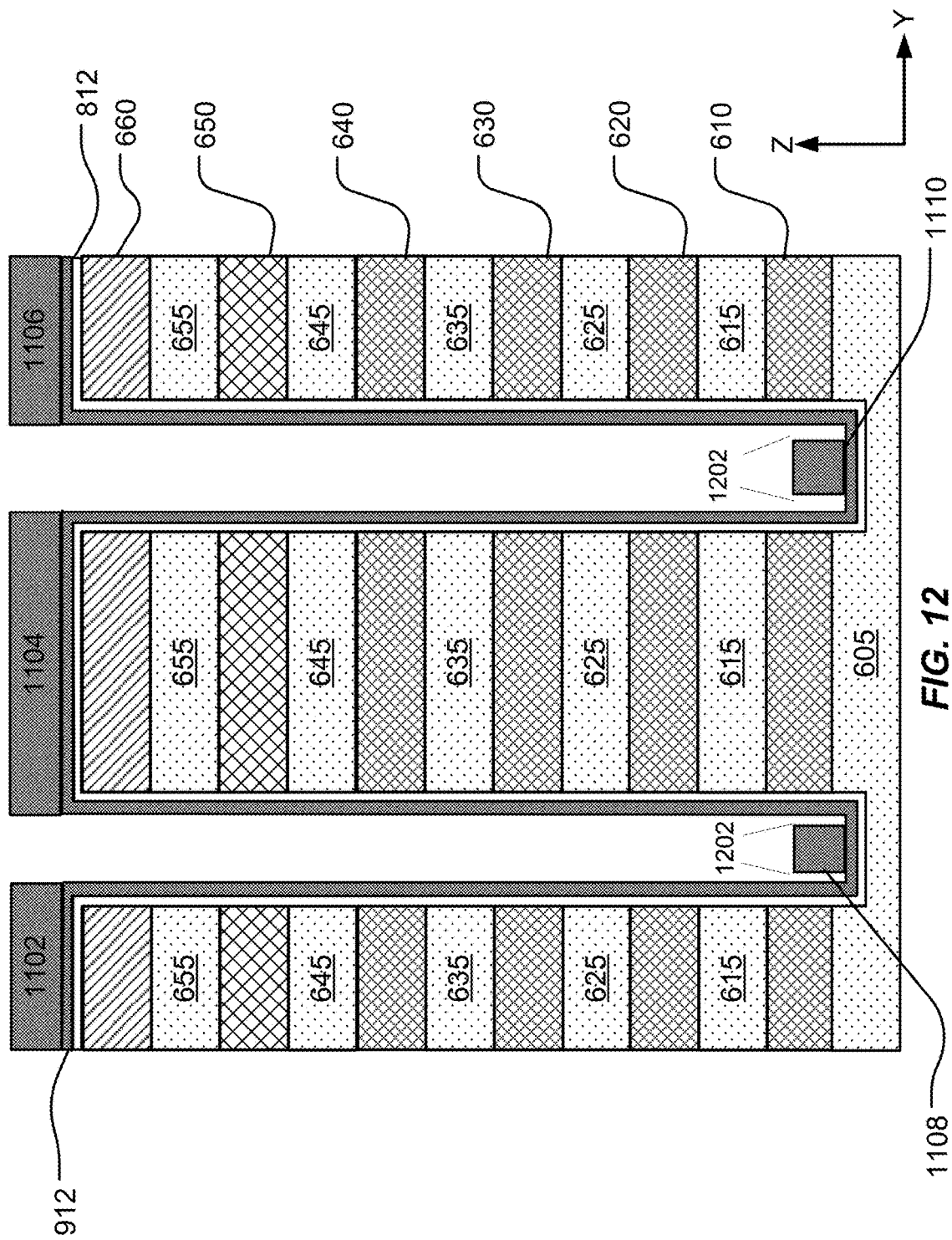

FIG. 12 illustrates a stage in the process flow after the masks 1012 are removed, resulting in gaps 1202 between the semiconductor pads 1108, 1110 and the first semiconductor layer 912. In one embodiment, the masks 1012 may be removed by wet etching with hydrofluoric acid or phosphoric acid.

Figure 13:
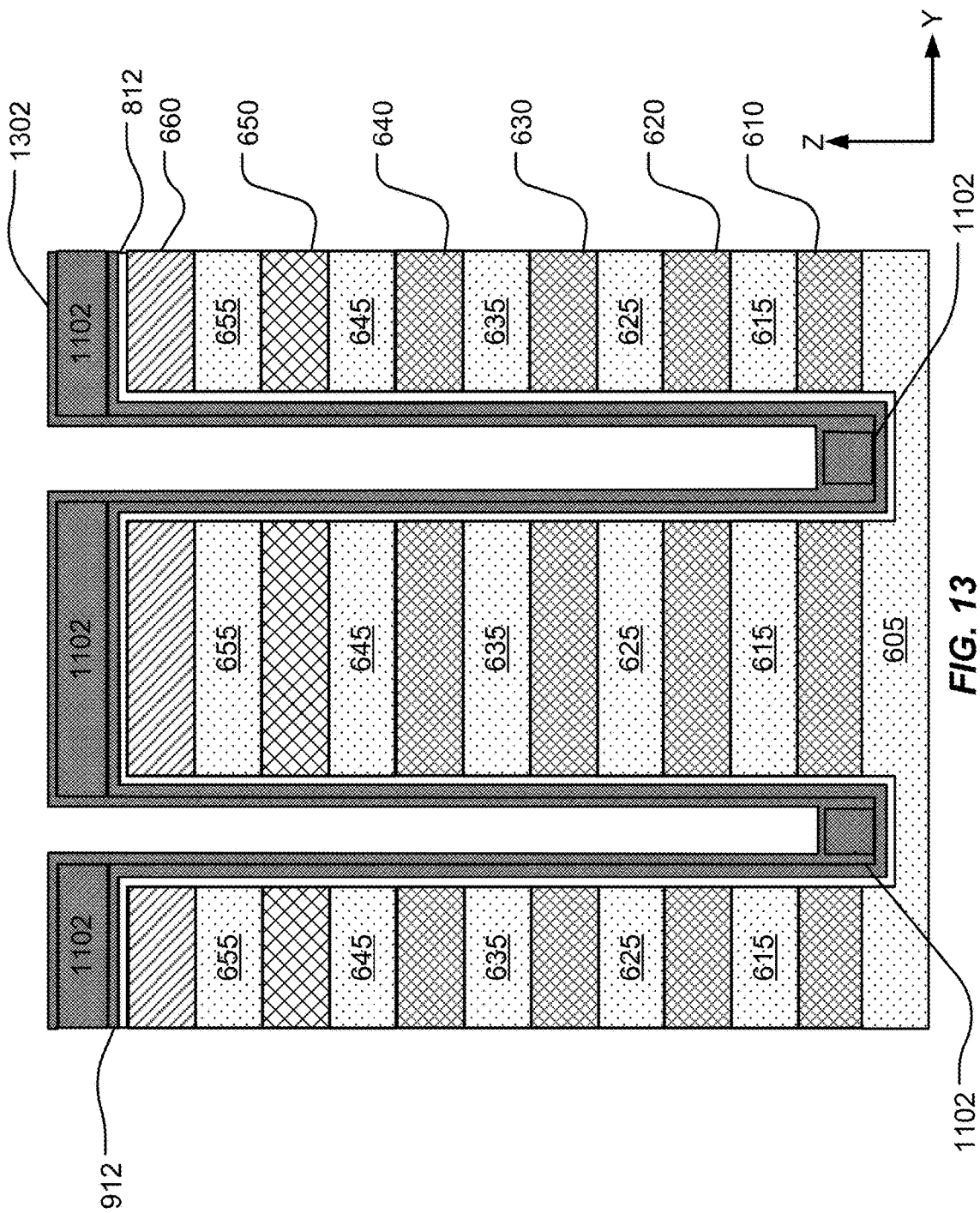

FIG. 13 illustrates a stage in the process flow after a second semiconductor layer 1302 is deposited over and having a surface conformal with semiconductor pads 1102, 1104, 1106, 1108, 1110 and the first semiconductor layer 912. Depositing the second semiconductor layer 1302 fills the gaps 1202 created after the masks are removed. The second semiconductor layer 1302 can have a thickness of about 10 nanometers or less. The semiconductor material in the second semiconductor layer 1302 comprises a semiconductor adapted by choice of material, e.g., silicon, and doping concentrations (e.g., undoped or lightly doped) to act as channel regions for vertical strings of memory cells.

The structure in FIG. 13 may be further annealed to connect and improve the electrical conductance between the semiconductor pads 1102, 1104, 1106, 1108, 1110, the first semiconductor layer 912 and the second semiconductor layer 1302, and form a vertical channel structure.

Figure 14:
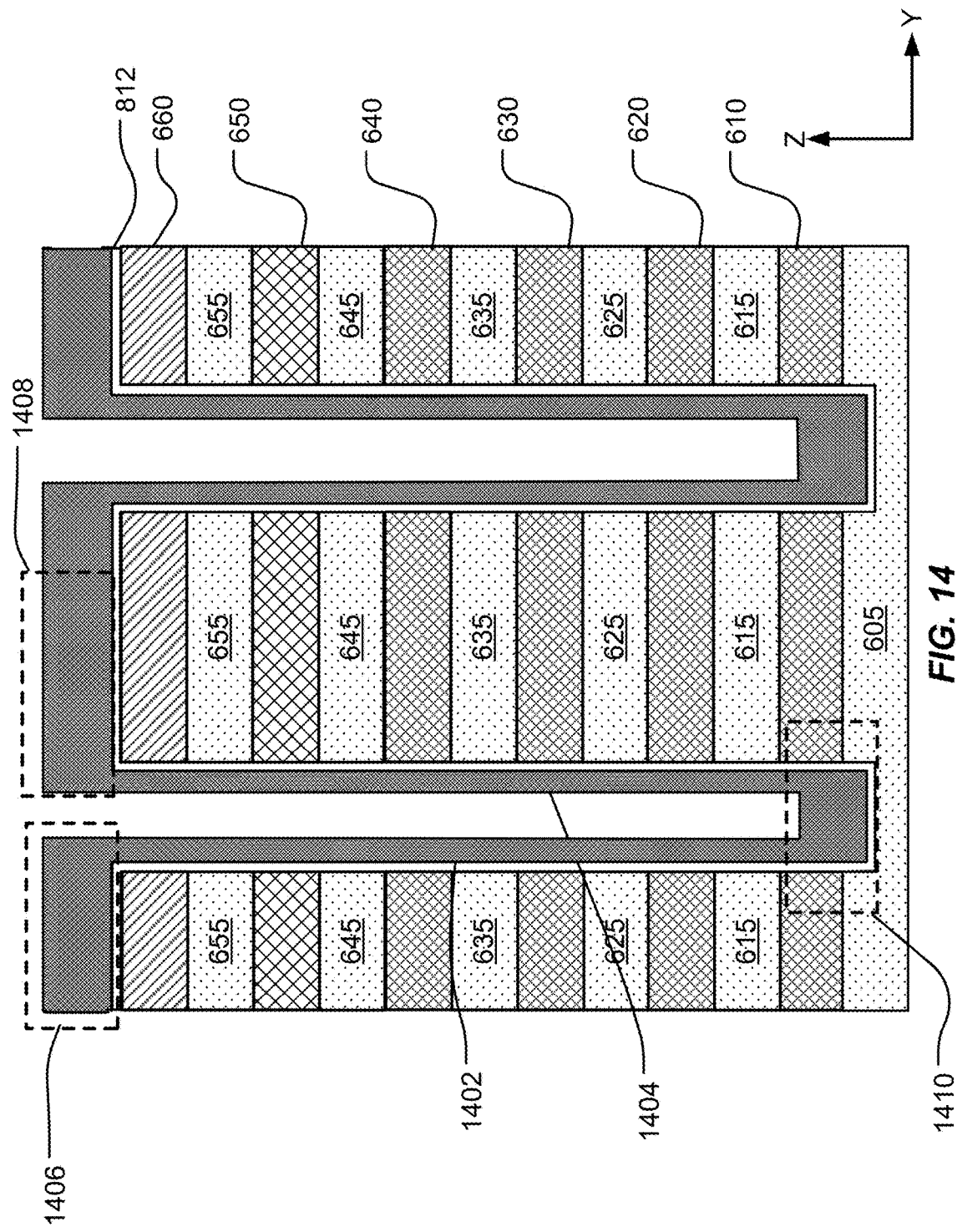

FIG. 14 illustrates a stage in the process flow after annealing. The structure comprises a vertical channel structure including vertical channel films 1402 and 1404 disposed on the sidewalls of the stacks. The vertical channel film 1402 is connected at the proximal end to a first upper channel pad 1406. The vertical channel film 1404 is connected at the proximal end to a second upper channel pad 1408. The vertical channel films 1402 and 1404 are connected at the distal ends to a lower channel pad 1410.

The structure in FIG. 14 may be further processed to form 3D memory devices as illustrated by FIGS. 11-18 in U.S. Pat. No. 9,524,980, which is incorporated by reference as if fully set forth herein. The openings between stacks are filled on the inside surfaces of the channel structure with an insulating material such as silicon dioxide. In one embodiment, an air gap may be left at least in regions adjacent the intermediate layers of conductive strips. After the filling step, pillars may be etched between the stacks to form a plurality of vertical channel structures in a honeycomb arrangement, so that each row of vertical channel structures is offset in the row direction from adjacent rows. This honeycomb arrangement facilitates the formation of overlying bit lines with a tighter pitch. The structure is then etched to form arrays of first stacks and second stacks, connected by vertical channel structures. The upper channel pads of the vertical channel structures provide thicker landing areas for interlayer connectors for connection to a common source line and the bit line. An array of contact plugs, which can be metal contact plugs, including tungsten plugs, are then formed along with a first patterned conductor layer including conductor lines connected to the GSL sides of the NAND strings (operated as common source lines) and a second patterned conductor layer including bit lines connected to the SSL sides of the NAND strings (operated as bit lines).

Figure 15:
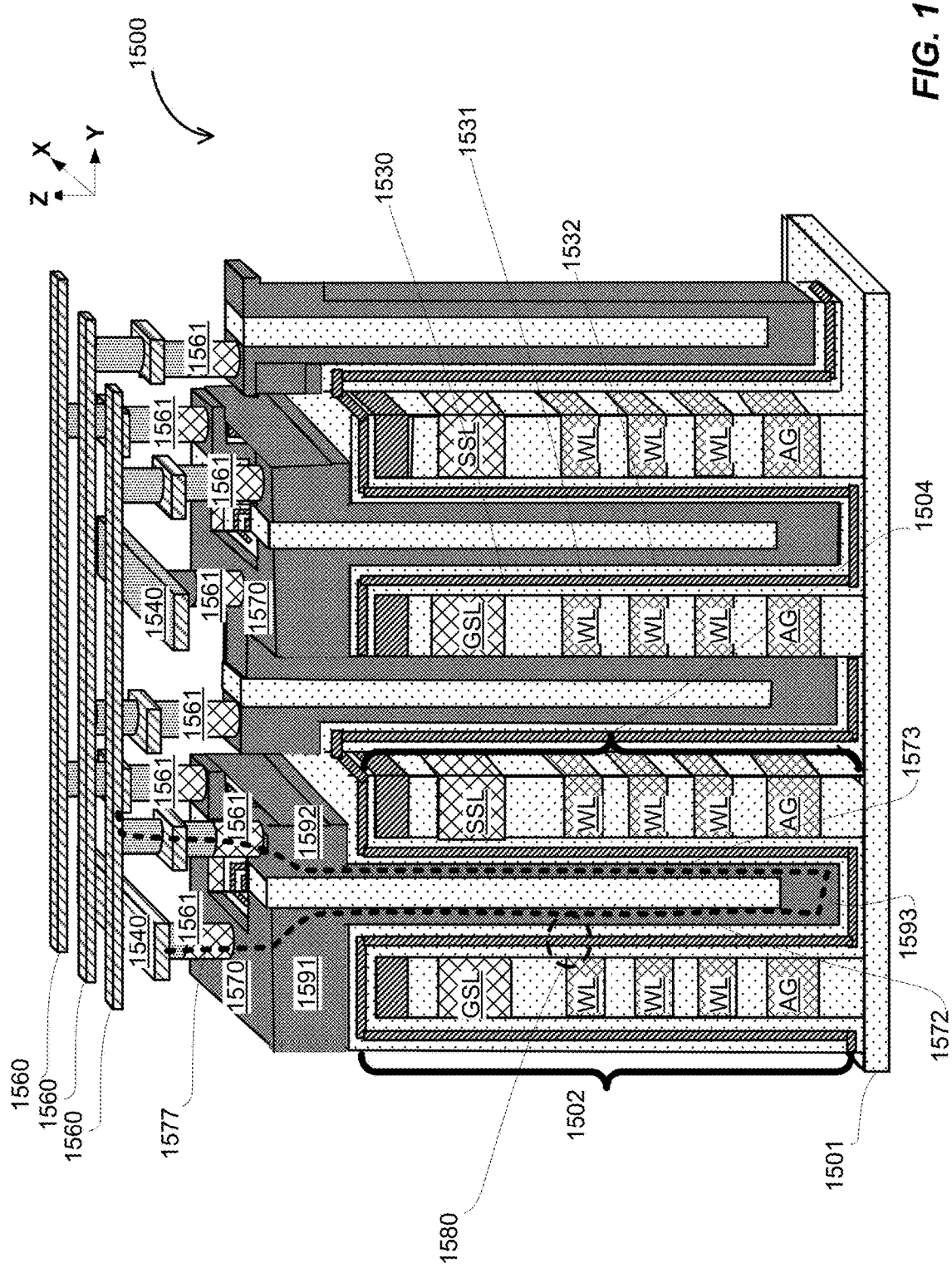
FIG. 15 is a simplified perspective diagram of a 3D memory device including a vertical channel structure including two vertical channel films, an upper channel pad and a lower channel pad.

FIG. 15 is a simplified perspective diagram of a 3D memory device 1500 including vertical channel structures as described herein. The memory device 1500 includes an array of NAND strings of memory cells. The memory device 1500 includes an integrated circuit substrate 1501, and a plurality of stacks of conductive strips separated by insulating material, including at least a top level of conductive strips (ground select lines or GSLs, and string select lines or SSLs), a plurality of intermediate levels of conductive strips (world lines or WLs), and a bottom level of conductive strips (assisted gate or AG). In the example shown in FIG. 15, a first stack 1502 includes a bottom level of conductive strips (AG), a plurality of intermediate levels of conductive strips (WLs), and a top level of conductive strips (GSL). A second stack 1504 includes a bottom level of conductive strips (AG), a plurality of intermediate levels of conductive strips (WLs), and a top level of conductive strips (SSL). Adjacent word lines in the first stack 1502 and the second stack 1504 are connected to separate bias circuits (not shown), so that two charge storage sites at the frustum of each vertical channel structure between the adjacent word lines can be separately accessed and used for data storage. This arrangement of independent word lines can be implemented for example by connecting first stack word lines to a first bias structure, and second stack of word lines to a separate bias structure, examples of which are described below.

The conductive strips acting as word lines, string select lines, ground select lines and an assisted gate can comprise a variety of materials including doped semiconductors, metals, and conductive compounds, including materials comprising Si, Ge, SiGe, SiC, TiN, TaN, W, and Pt.

A vertical channel structure 1570 is disposed between the first stack 1502 and the second stack 1504. The vertical channel structure 1570 comprises vertical channel films 1572 and 1573 disposed on the sidewalls of the first stack 1502 and the second stack 1504, respectively. The vertical channel films 1572 and 1573 are connected to a first upper channel pad 1591 at the top of the first stack 1502 and to a second upper channel pad 1592 at the top of the second stack 1504. Both the vertical channel films 1572 and 1573 are connected at the distal ends to a lower channel pad 1593.

In the illustrated example, a plurality of bit line structures 1560 and a plurality of common source line structures 1540 are arranged orthogonally over the first and second stacks, and are connected to the plurality of first and second stacks through the first upper channel pad 1591 and the second upper channel pad 1592 of the vertical channel structure 1570 and interlayer connectors 1561.

The memory device includes memory layers, such as data storage structures, in interface regions at cross-points 1580 between side surfaces of the first and second conductive strips in the plurality of intermediate planes (WLs) in the stacks and the vertical channel structure 1570. The memory layer can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

In a representative device, the dielectric layer of memory material can include a bandgap engineered composite tunneling dielectric layer comprising a layer of silicon dioxide 1530 less than 2 nm thick, a layer of silicon nitride 1531 less than 3 nm thick, and a layer of silicon dioxide 1532 less than 4 nm thick. In one embodiment, the composite tunneling dielectric layer consists of an ultrathin silicon oxide layer $O_1$ (e.g., <=15 Å), an ultrathin silicon nitride layer $N_1$ (e.g. <=30 Å) and an ultrathin silicon oxide layer $O_2$ (e.g. <=35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g., about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier because the second location is at a greater distance from the interface. Therefore, the $O_2$ layer does not significantly interfere with the electric field assisted hole tunneling, while improving the ability of the engineered tunneling dielectric to block leakage during low fields. These layers can be conformally deposited using for example LPCVD. A charge trapping layer in the layer of memory material in one embodiment comprises silicon nitride having a thickness greater than 50 Å, including for example about 70 Å. Other charge trapping materials and structures may be employed, including for example silicon oxynitride ($Si_xO_yN_z$), silicon-rich nitride, silicon-rich oxide, trapping layers including embedded nano-particles and so on. The blocking dielectric layer of memory material in one embodiment comprises a layer of silicon dioxide having a thickness greater than 50 Å, including for example about 90 Å, and can be formed by LPCVD or another wet conversion from the nitride by a wet furnace oxidation process. Other blocking dielectrics can include high-κ materials like aluminum oxide.

In the illustrated example, the memory cells in the cross-points 1580 on the opposing sides of the first and second stacks of conductive strips are configured in a NAND string. The NAND string can be operated for read, erase and program operations. A circuit path 1577 illustrates the current flow for the NAND string which is connected to the common source line structures 1540 and the bit line structures 1560, through the first upper channel pad 1591, the vertical channel film 1572, the lower channel pad 1593, the vertical channel film 1573, and the second upper channel pad 1592. The first upper channel pad 1591 over the first stack provides a better connection for the vertical channel structure 1570 and the common source line structure 1540. The second upper channel pad 1592 over the second stack provides a better connection for the vertical channel structure 1570 and the bit line structures 1560. The lower channel pad 1593 in the lower region of the vertical channel structure 1570 overlaps with the assist gate lines, thereby enabling the assist gate lines to have increased control of the conductivity near the lower regions of the vertical channel structures.

Figure 16:
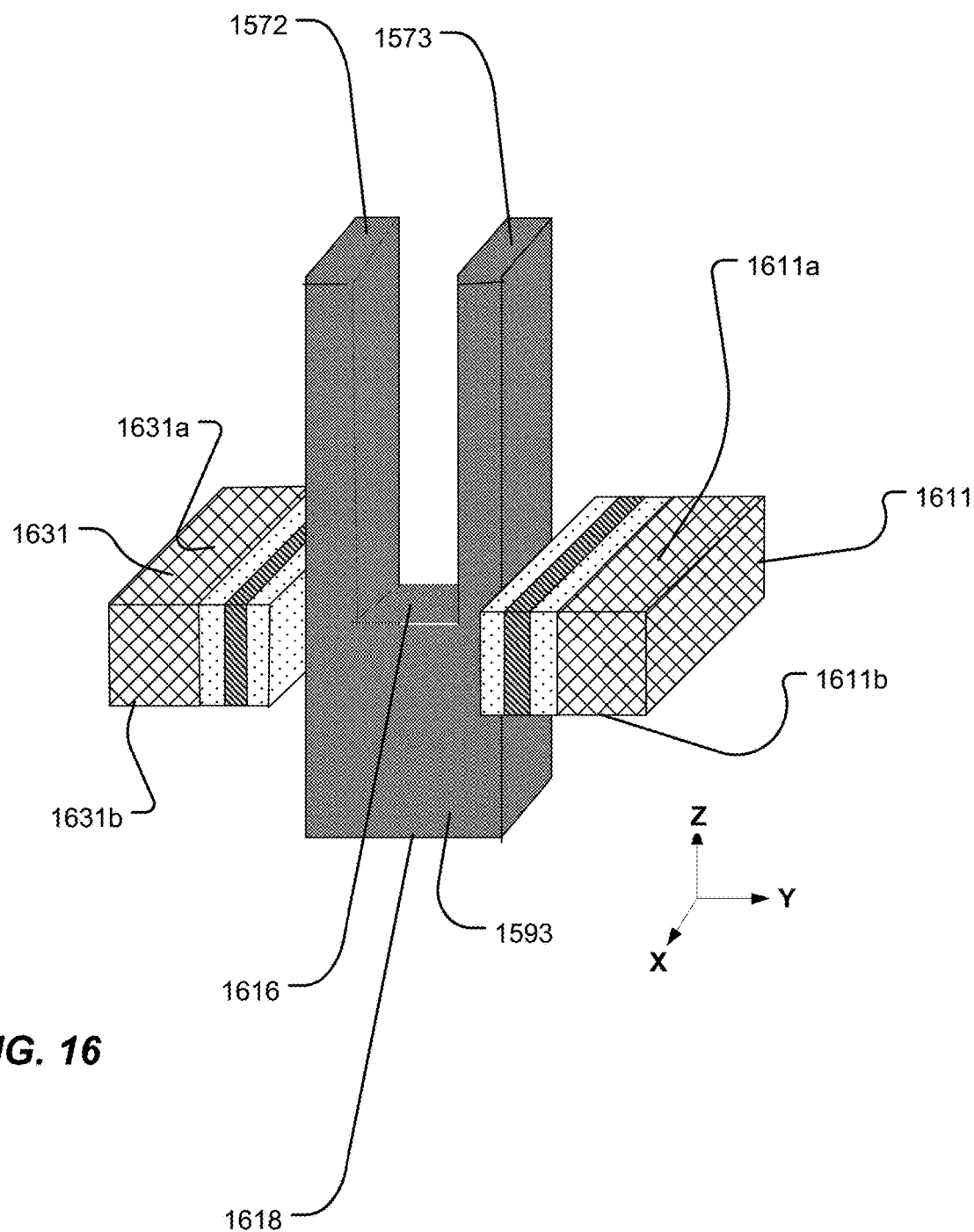
FIG. 16 is a perspective view of a lower section of a vertical channel structure in the 3D memory device in FIG. 15.

FIG. 16 is a perspective view of a lower region of the channel structure 1570 in the 3D memory device 1500 as described herein. The embodiment illustrated in FIG. 16 includes the vertical channel film 1572 and the vertical channel film 1573. The vertical channel films are preferably thin-films, having thicknesses of 20 nm or less. The vertical channel films are connected to a lower channel pad 1593 with an upper surface 1616 and a lower surface 1618. A first side stack of semiconductor strips includes strip 1631 which can be configured as an assist gate line. The first assist gate line 1631 has an upper surface 1631a and a lower surface 1631b. A second side stack of semiconductor strips includes strip 1611 which can also be configured as an assist gate line. The second assist gate line 1611 has an upper surface 1611a and a lower surface 1611b. The upper surface 1616 of the lower channel pad 1593 is above the lower surface 1631b of the first assist gate line 1631 and the lower surface 1611b of the second assist gate line 1611. The lower surface 1618 of the lower channel pad 1593 is below the lower surface 1631b of the first assist gate line 1631 and the lower surface 1611b of the second assist gate line 1611. Therefore, the resistance of the lower region of the channel structure 1570 can be controlled by the first assist line 1631 and the second assist line 16111 during the read operation of the memory cells due to their overlap with the lower channel pad 1593. Switching the assist lines 1631 and 1611 will enable the lower region of the channel structure 1570 to have a low resistance during the read operation. In some embodiments, the lower channel pad 1593 may comprise a semiconductor material with higher doping than that found in the vertical channel films 1572 and 1573. Therefore, the lower channel pad 1593 may have a higher conductivity when compared to the conductivities of the vertical channel films 1572, 1573.

Figure 17:
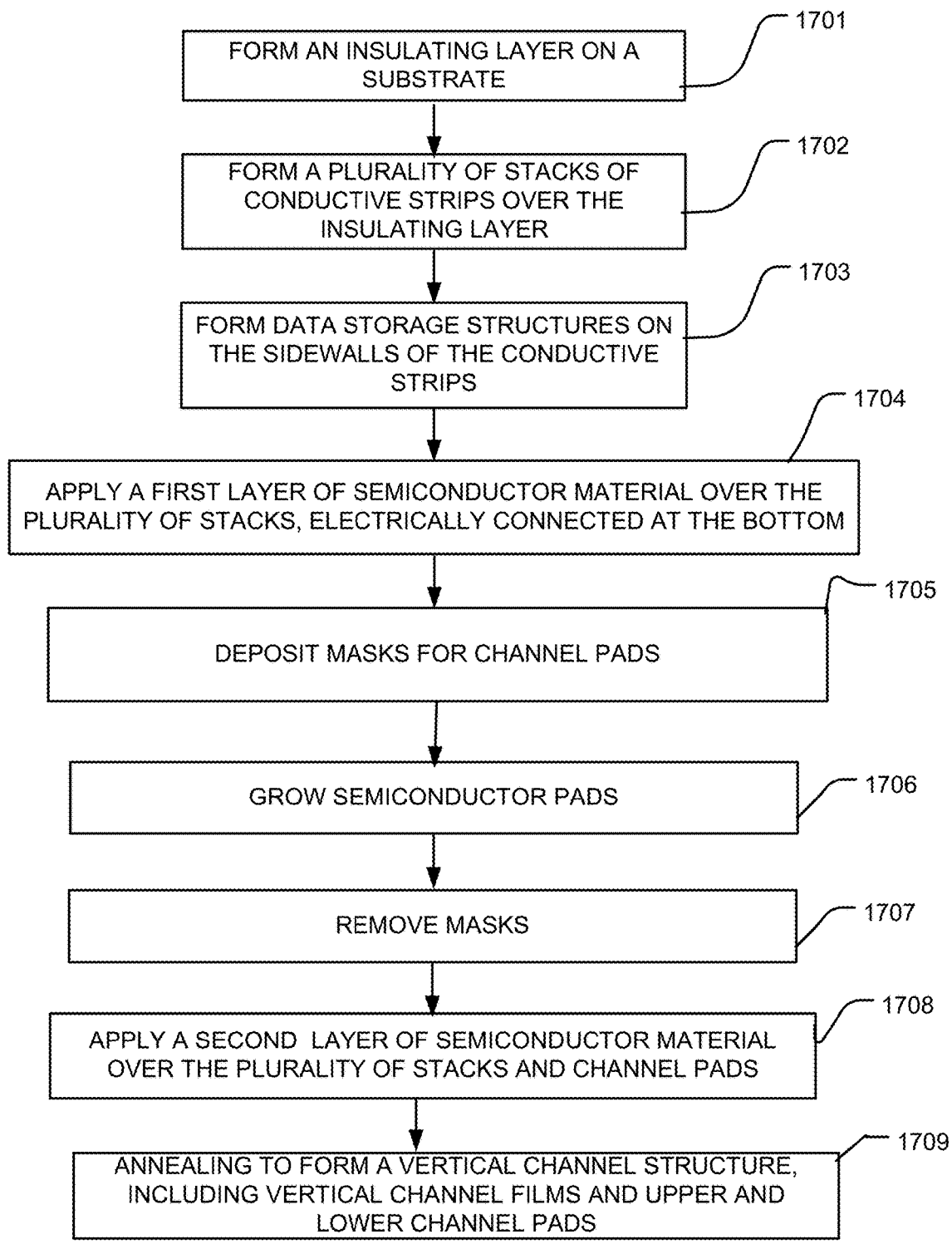
FIG. 17 is a flowchart illustrating a method for manufacturing a 3D memory device with vertical channel films and channel pads as described herein.

FIG. 17 is a flowchart illustrating a method for manufacturing a 3D memory with vertical channel films and channel pads as described herein. The method includes identifying areas on a substrate for formation of a vertical channel structure having a structure like that of FIG. 14. For each area, the method includes forming an insulating layer on the substrate by, for example, depositing a layer of silicon dioxide, or other dielectric material or combination of materials on the substrate (step 1701). Over the insulating layer (e.g., 605 in FIG. 6), the process includes forming a plurality of layers of a first conductive material, suitable to act as word lines, separated by insulating material (step 1702), and etching the plurality of layers to define a plurality of stacks (e.g., 702, 704, 706 in FIG. 7) of conductive strips and a plurality of openings (e.g., 710, 720 in FIG. 7) (step 1703). The stacks can include at least a bottom plane (assist gates) of conductive strips, a plurality of intermediate planes (WLs) of conductive strips, and a top plane of conductive strips (SSLs and GSLs).

The method includes forming a memory layer (e.g., 812 in FIG. 8) on side surfaces of conductive strips in the plurality of stacks to provide data storage structures (step 1703). The memory layer can comprise a dielectric charge trapping layer and are in contact with the side surfaces of the plurality of conductive strips.

The method includes forming a first semiconductor layer (e.g., 912 in FIG. 9) over and having a surface conformal with the memory layer on the plurality of stacks (step 1704). The first semiconductor layer extends down the sidewalls of the trenches between the stacks, and over the bottom of the openings.

A thin layer of silicon oxide or silicon nitride is deposited and then etched to form masks (e.g., 1012 in FIG. 10) on the first semiconductor layer on the sidewalls of adjacent stacks (step 1705). The masks expose areas for the growth of semiconductor pads.

Then, the semiconductor pads are grown by SEG in the areas exposed by the masks as discussed with reference to FIG. 11 (step 1706). The semiconductor pads may have a higher N+ doping than the first semiconductor layer. The mask is then removed (step 1707) and a second semiconductor layer (1302 in FIG. 13) is deposited (step 1708) as discussed above with reference to FIG. 12 and FIG. 13. The first semiconductor layer, the second semiconductor pads, and the second semiconductor are then annealed (step 1709) to form a vertical channel structure. The vertical channel structure comprises vertical channel films (e.g., 1402 and 1404 in FIG. 14) disposed on the sidewalls of the first and second stacks. The vertical channel films are connected at the proximal end to a first upper channel pad (e.g., 1406 in FIG. 14) and a second upper channel pad (e.g., 1408 in FIG. 14), and at the distal end to a lower channel pad (e.g., 1410 in FIG. 14).

Figure 18:
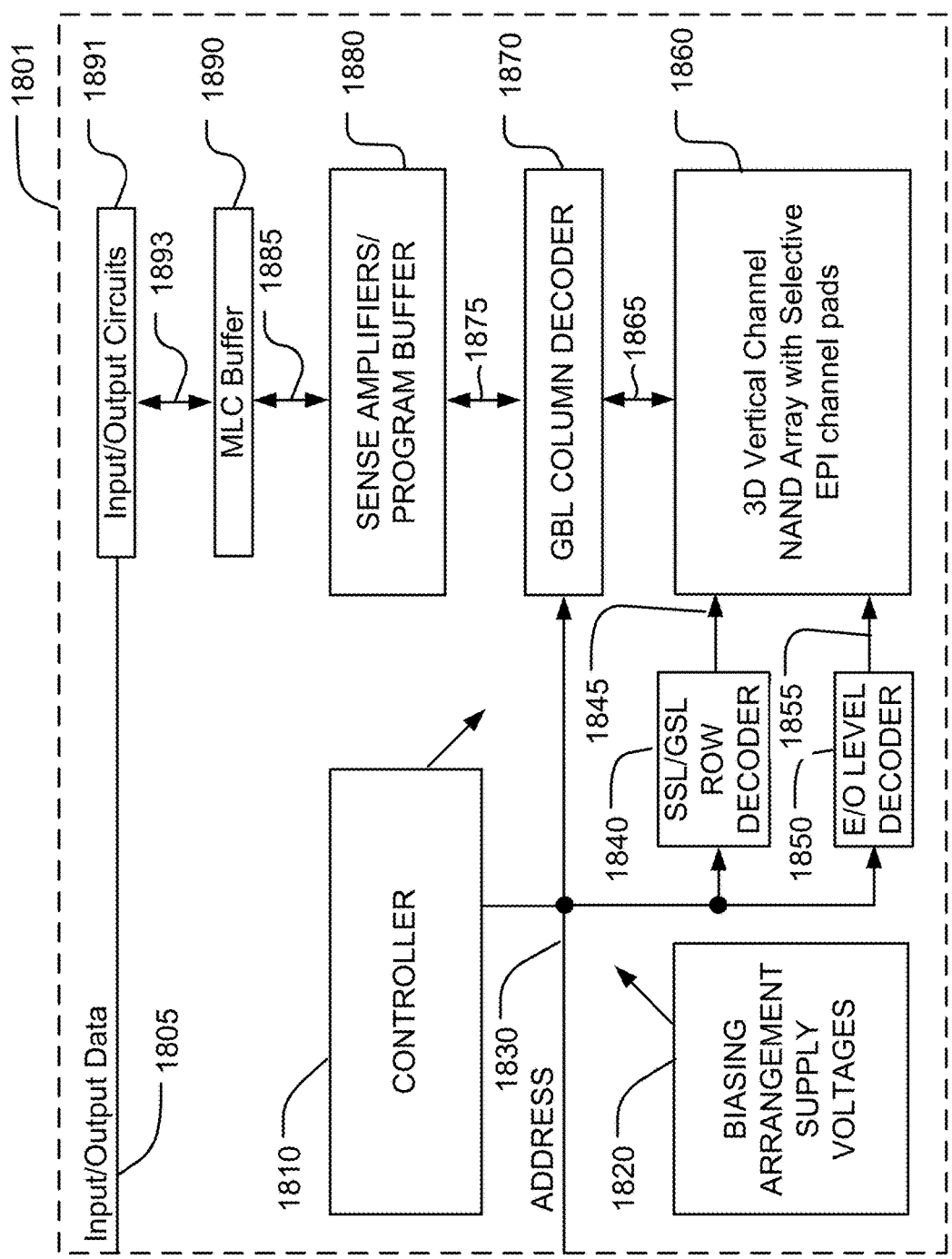
FIG. 18 is a block diagram of an integrated circuit memory including a 3D memory array having vertical channel films and channel pads.

FIG. 18 is a simplified chip block diagram of an integrated circuit 1801 including a 3D NAND array with vertical channel films and channel pads. The integrated circuit 1801 includes a memory array 1860 including one or more memory blocks as described herein with vertical channel structures comprising vertical channel films and channel pads on an integrated circuit substrate.

An SSL/GSL decoder 1840 is coupled to a plurality of SSL/GSL lines 1845, arranged in the memory array 1860. A first/second level decoder 1850 is coupled to a plurality of first/second word lines 1855. A global bit line column decoder 1870 is coupled to a plurality of global bit lines 1865 arranged along columns in the memory array 1860 for reading data from and writing data to the memory array 1860. Addresses are supplied on bus 1830 from control logic 1810 to decoder 1870, decoder 1840 and decoder 1850. Sense amplifier and program buffer circuits 1880 are coupled to the column decoder 1870, in this example via first data lines 1875. The program buffer in circuits 1880 can store program data to indicate program or inhibit states for selected bit lines. The column decoder 1870 can include circuits for selectively applying program and inhibit voltages to bit lines in the memory in response to the data values in the program buffer.

Sensed data from the sense amplifier/program buffer circuits are supplied via second data lines 1885 to multi-level data buffer 1890, which is in turn coupled to input/output circuits 1891 via a data path 1893. Also, input data is applied in this example to the multi-level data buffer 1890 for use in support of multiple-level program operations for each of the independent sides of the independent double gate cells in the array.

Input/output circuits 1891 drive the data to destinations external to the integrated circuit 1801. Input/output data and control signals are moved via data bus 1805 between the input/output circuits 1891, the control logic 1810 and input/output ports on the integrated circuit 1801 or other data sources internal or external to the integrated circuit 1801, such as a general purpose processor or special purpose application circuitry, or a combination of modules providing system-on-a-chip functionality supported by the memory array 1860.

In the example shown in FIG. 18, control logic 1810, using a bias arrangement state machine, controls the application of supply voltages generated or provided through the voltage supply or supplies in block 1820, such as read, erase, verify and program bias voltages. The control logic 1810 is coupled to the multi-level data buffer 1890 and the memory array 1860. The control logic 1810 includes logic to control multiple-level program operations. In embodiments supporting the vertical NAND structures described herein, the logic is configured to perform the method of: (i) selecting a layer of memory cells in the array, such as using a word line layer decoder; (ii) selecting a side of the vertical channel structures in the selected layer such as by selecting a second or first side word line structure; (iii) selecting vertical channel structures in a selected row in the array such as by using SSL switches and GSL switches on the rows of vertical channel structures; and (iv) storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of second and first interdigitated word line structures in the selected layer of the array, such as by controlling the second and first word line layer decoders.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell. Also, single-bit-per-cell embodiments can include the structures described herein.

The control logic 1810 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a stack;
an opening through the stack exposing sidewalls of conductive strips on first and second sides of the opening;
data storage structures on the sidewalls of one or both sides of the opening; and
a vertical channel film disposed vertically in contact with the data storage structures, wherein the vertical channel film is connected at a proximal end to an upper channel pad over the stack and at a distal end to a lower channel pad disposed in a lower level of the opening, wherein the upper channel pad comprises an epitaxial semiconductor and is thicker than the vertical channel film disposed on the sidewalls.

2. The memory device of claim 1, wherein the upper and lower channel pads comprise the epitaxial semiconductor.

3. The memory device of claim 1, including one or more patterned conductor layers over the stack, including a source line, and an interlayer connector connecting the source line to the upper channel pad over the stack.

4. The memory device of claim 1, including one or more patterned conductor layers over the stack, including a bit line, and an interlayer connector connecting the bit line to the upper channel pad over the stack.

5. The memory device of claim 1, wherein the data storage structures comprise a multilayer dielectric charge trapping structure.

6. The memory device of claim 1, wherein the stack includes a conductive strip in a bottom level of the stack configured as an assist gate, the conductive strip in the bottom level having a lower surface, and the lower channel pad in a lower level of the opening includes an upper surface and the upper surface of the lower channel pad is above the lower surface of the conductive strip in the bottom level.

7. The memory device of claim 1, wherein the upper and lower channel pads include a greater concentration of N+ doping compared to the vertical channel film.

8. The memory device of claim 1, comprising:
a second vertical channel film disposed vertically in contact with the data storage structures, wherein the second vertical channel film is connected at a proximal end to a second upper channel pad over the stack and at a distal end to the lower channel pad disposed in the lower level of the opening, wherein the second upper channel pad comprises the epitaxial semiconductor and is thicker than the second vertical channel film disposed on the sidewalls, wherein the first-mentioned vertical channel film and the second vertical channel film are separated from each other between the upper and lower channel pads.

9. A manufacturing method, comprising:
forming a stack;
forming an opening through the stack exposing sidewalls of conductive strips on first and second sides of the opening;
forming data storage structures on the sidewalls of one or both sides of the opening; and
forming a vertical channel film disposed vertically in contact with the data storage structures; and
forming an upper channel pad over the stack, the upper channel pad contacting the vertical channel film at a proximal end, and forming a lower channel pad in a lower level of the opening, the lower channel pad contacting the vertical channel film at a distal end, wherein forming the upper channel pad comprises an epitaxial growth of semiconductor.

10. The method of claim 9, including forming the upper and lower channel pads using said epitaxial growth.

11. The method of claim 9, including forming one or more patterned conductor layers over the stack, including a source line, and forming an interlayer connector connecting the source line to the upper channel pad over the stack.

12. The method of claim 9, including forming one or more patterned conductor layers over the stack, including a bit line, and forming an interlayer connector connecting the bit line to the upper channel pad over the stack.

13. The method of claim 9, wherein forming the data storage structures comprises forming a multilayer dielectric charge trapping structure.

14. The method of claim 9, wherein forming the stack includes forming a conductive strip in a bottom level of the stack configured as an assist gate, the conductive strip in the bottom level having a lower surface, and the lower channel pad in a lower level of the opening includes an upper surface and the upper surface of the lower channel pad is above the lower surface of the conductive strip in the bottom level.

15. The method of claim 9, wherein forming the stack includes forming a plurality of layers of conductive material separated by layers of insulating material, and forming the opening includes etching the opening in the stack.

16. The method of claim 9, wherein forming the vertical channel film includes depositing a first layer of a first semiconductor material over the stack, and etching a pattern in the first layer to define the vertical channel film.

17. The method of claim 9, wherein forming the upper and lower channel pads comprises:
 depositing a mask on the vertical channel film exposing areas of at least one of the upper and lower channel pads; and
 depositing a second semiconductor material by selective epitaxial growth in the exposed areas.

18. The method of claim 17, wherein forming the upper and lower channel pads further comprises:
 removing the mask, creating gaps between the upper pad and the vertical channel film; and
 depositing a second layer of a first semiconductor material to fill the gaps.

19. The method of claim 17, wherein forming the upper and lower pads includes depositing a second semiconductor material with greater concentration N+ doping than a first semiconductor material of the vertical channel film.

* * * * *